United States Patent
Kawakami et al.

(10) Patent No.: US 7,388,383 B2
(45) Date of Patent: Jun. 17, 2008

(54) DETECTING METHOD AND DETECTING APPARATUS FOR DETECTING INTERNAL OF RECHARGEABLE BATTERY, RECHARGEABLE BATTERY PACK HAVING SAID DETECTING APPARATUS THEREIN, APPARATUS HAVING SAID DETECTING APPARATUS THEREIN, PROGRAM IN WHICH SAID DETECTING METHOD IS INCORPORATED, AND MEDIUM IN WHICH SAID PROGRAM IS STORED

(75) Inventors: Soichiro Kawakami, Nara (JP); Yasusaburo Degura, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 18 days.

(21) Appl. No.: 11/656,995

(22) Filed: Jan. 24, 2007

(65) Prior Publication Data
US 2007/0120554 A1 May 31, 2007

Related U.S. Application Data

(62) Division of application No. 10/682,454, filed on Oct. 10, 2003, now Pat. No. 7,190,171.

(30) Foreign Application Priority Data
Oct. 11, 2002 (JP) .............................. 2002-298171

(51) Int. Cl.
*G01N 27/416* (2006.01)
(52) U.S. Cl. ........................................ 324/430; 702/63
(58) Field of Classification Search ................ 324/426, 324/427, 430; 320/141, 149, 152; 702/63
See application file for complete search history.

(56) References Cited

U.S. PATENT DOCUMENTS

| 5,175,485 A | 12/1992 | Joo | 320/159 |
| 5,596,259 A | 1/1997 | Mino et al. | 320/157 |
| 5,670,862 A | 9/1997 | Lewyn | 320/149 |
| 5,703,466 A | 12/1997 | Honda et al. | 320/152 |
| 5,905,364 A | 5/1999 | Ookita | 320/141 |
| 5,998,966 A | 12/1999 | Gaza | 320/116 |

(Continued)

FOREIGN PATENT DOCUMENTS

EP 1 049 231 11/2000

(Continued)

*Primary Examiner*—Adolf Berhane
*Assistant Examiner*—M'Baye Diao
(74) *Attorney, Agent, or Firm*—Fitzpatrick, Cella, Harper & Scinto

(57) ABSTRACT

A detecting method for detecting internal resistance of an inspective rechargeable battery when said inspective rechargeable battery is charged by the constant current-constant voltage charging regime, said detecting method comprising at least a step (a) wherein an accumulated, charged electricity quantity of said inspective rechargeable battery in the constant voltage charging mode is obtained and a step (b) wherein said charged electricity quantity of said inspective rechargeable battery obtained in the constant voltage charging mode in said step (a) is referred to previously acquired data of a normal rechargeable battery, which corresponds to said inspective rechargeable battery, with respect to relationships of charged electricity quantities $Q_{cv}$ thereof versus internal resistances thereof when increased or decreased or their increased or decreased magnitudes in the constant voltage charging mode.

9 Claims, 10 Drawing Sheets

U.S. PATENT DOCUMENTS

| | | | |
|---|---|---|---|
| 6,563,318 B2 | 5/2003 | Kawakami et al. | 324/426 |
| 6,683,440 B2 | 1/2004 | Kawakami et al. | 320/133 |
| 6,812,674 B2 | 11/2004 | Hoffman | 320/162 |
| 2002/0193953 A1* | 12/2002 | Hoenig et al. | 702/63 |

FOREIGN PATENT DOCUMENTS

| | | |
|---|---|---|
| JP | 7-240235 | 9/1995 |
| JP | 9-134742 | 5/1997 |
| JP | 2002-50410 | 2/2002 |
| JP | 2002-142379 | 5/2002 |
| JP | 2003-59544 | 2/2003 |

* cited by examiner

F I G. 2
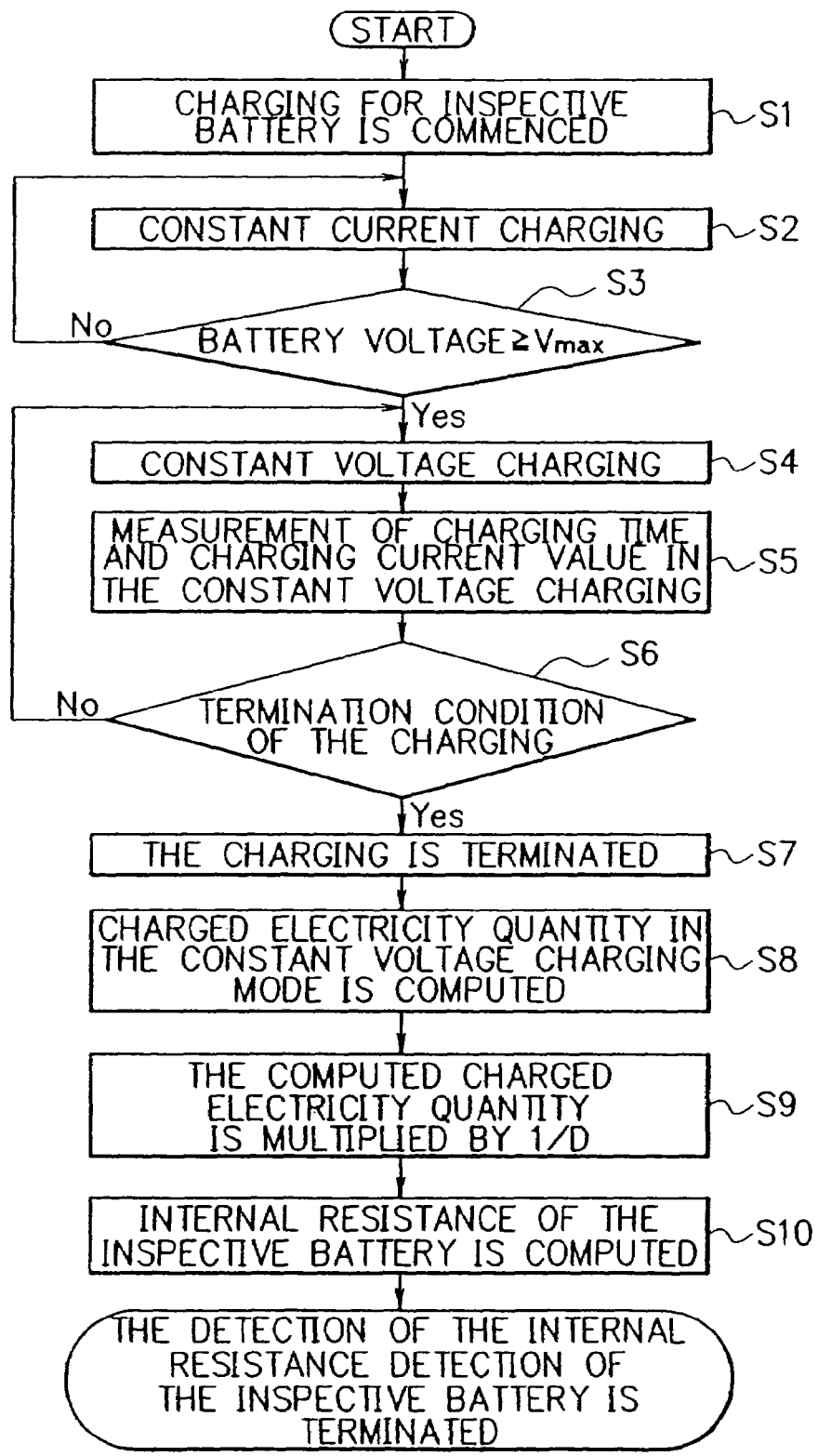

F I G. 9
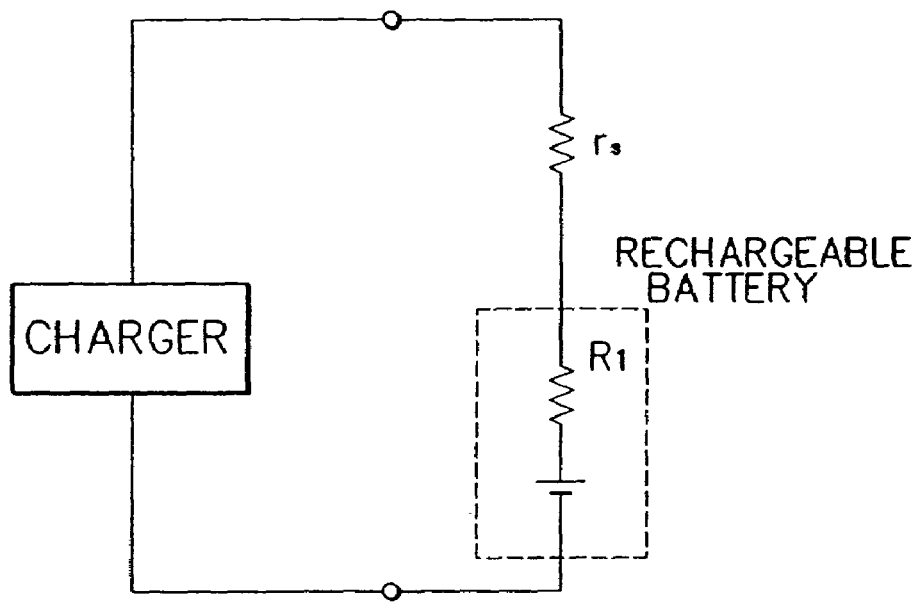
F I G. 10
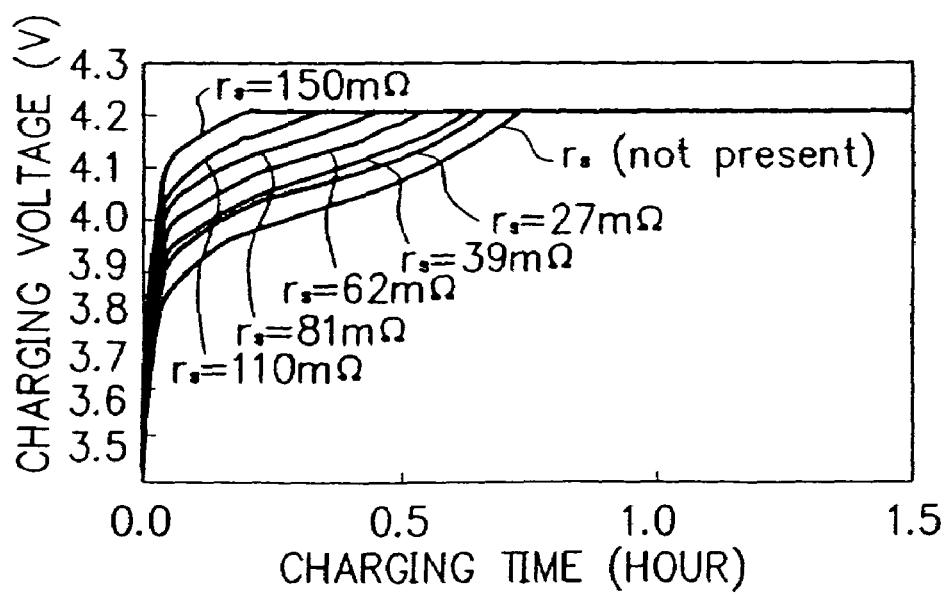

F I G. 11
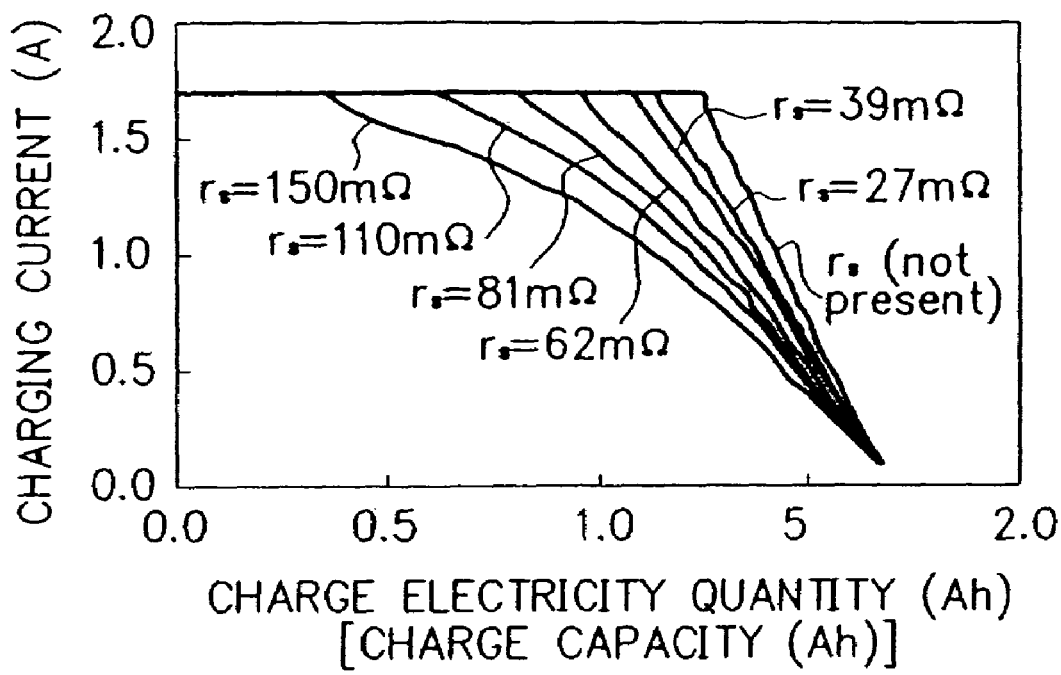
F I G. 12
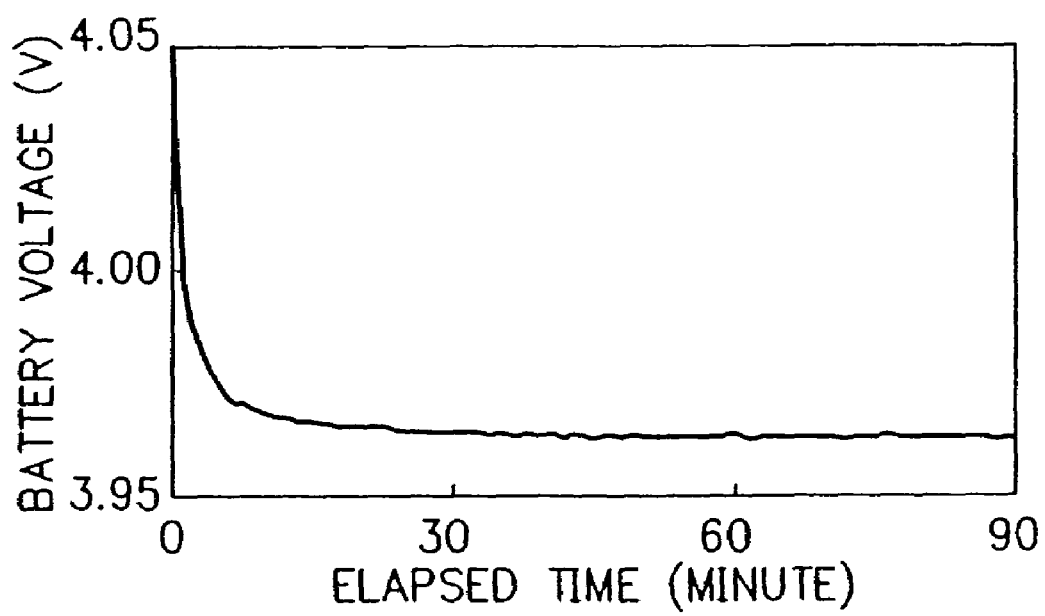

DETECTING METHOD AND DETECTING APPARATUS FOR DETECTING INTERNAL OF RECHARGEABLE BATTERY, RECHARGEABLE BATTERY PACK HAVING SAID DETECTING APPARATUS THEREIN, APPARATUS HAVING SAID DETECTING APPARATUS THEREIN, PROGRAM IN WHICH SAID DETECTING METHOD IS INCORPORATED, AND MEDIUM IN WHICH SAID PROGRAM IS STORED

This application is a divisional of application Ser. No. 10/682,454, filed Oct. 10, 2003, the contents of which are incorporated herein by reference.

BACKGROUND OF THE INVENTION

1. Field of the Invention

The present invention relates to a detecting method and a detecting apparatus for detecting internal resistance of a rechargeable battery to be inspected, particularly, for instance, internal resistance of a rechargeable battery to be inspected in a rechargeable battery pack having a control circuit in which one or more of a switching element for charging which is capable of performing ON-OFF control, a switching element for discharging, and a detecting element for detecting a charge-and-discharge current value are accommodated in a charging-and-discharging path of said rechargeable battery.

The present invention also relates to a rechargeable battery pack having said detecting apparatus provided therein, and an apparatus in which said detecting apparatus is provided.

The present invention includes a program in which said detecting method is incorporated and a medium in which said program is stored.

A rechargeable battery to be inspected which is subjected to the detection of internal resistance thereof in the present invention will be hereinafter referred to as "inspective rechargeable battery".

2. Related Background Art

In recent years, along with development of semiconductor elements and development of miniature, light-weight and high performance rechargeable battery, mobile instruments such as portable personal computers, video cameras, digital cameras, cellular phones, and personal digital assistants including palmtop PCs have been rapidly progressed.

Separately, in recent years, the global warming of the earth because of the so-called greenhouse effect to an increase in the content of $CO_2$ gas in the air has been predicted. For instance, in thermal electric power plants, thermal energy obtained by burning a fossil fuel is converted into electric energy, and along with burning of such fossil fuel, a large amount of $CO_2$ gas is exhausted in the air. Accordingly, in order to suppress this situation, there is a tendency of prohibiting to newly establish a thermal electric power plant. Under these circumstances, so-called load leveling practice has been proposed in order to effectively utilize electric powers generated by power generators in thermal electric power plants or the like, wherein using a load conditioner having a rechargeable battery installed therein, a surplus power unused in the night is stored in rechargeable battery installed at general houses and the power thus stored is used in the daytime when the demand for power is increased, whereby the power consumption is leveled.

Further, in recent years, electric vehicles having rechargeable battery and which do not exhaust any polluting substances have been proposed. Besides, hybrid powered automobiles in which a combination of a rechargeable battery and an internal combustion engine or a fuel cell is used and the fuel efficiency is heightened while restraining exhaustion of polluting substances have been also proposed. As the rechargeable battery used in these electric vehicles and hybrid powered automobiles, a high performance rechargeable battery having a high energy density is expected to be developed.

Incidentally, in the mobile instrument, the load conditioner in the load leveling, the electric vehicle or the hybrid powered automobile in which the rechargeable battery is used as above described, it is possible to extend the operation time to the maximum by properly controlling the power outputted from the rechargeable battery depending on internal resistance of the battery on the side of the apparatus in which the battery is accommodated, or it is possible to avoid occurrence of sudden stall of the operation by previously knowing the time necessary to exchange the battery based on information relating to the lifetime of the battery, which is acquired from the internal resistance of the battery. Therefore, in order to prevent the operation of the mobile instrument, the load conditioner, the electric vehicle or the hybrid powered automobile from being suddenly stopped, it is very important to be able to precisely detect the internal resistance of the rechargeable battery used therein.

Separately, in the mobile instrument, the load conditioner, the electric vehicle or the hybrid powered automobile, there is often used a rechargeable battery pack having a rechargeable battery therein and which has a control circuit in which one or more of a switching element for charging which is capable of performing ON-OFF control, a switching element for discharging, and a detecting element for detecting a charge-and-discharge current value are accommodated in a charging-and-discharging path of said rechargeable battery. In this case, it is also very important to be able to precisely detect internal resistance-related information of the whole rechargeable battery pack due to abnormality or deterioration of not only the rechargeable battery but also the respective elements in the battery pack.

Japanese Laid-open Patent Publication No. Hei.9(1997)-134742 (hereinafter referred to as document 1) discloses a method wherein for a rechargeable battery, the internal impedance directly before reaching the discharge termination voltage is measured by an impedance-measuring instrument while flowing an alternate current to determine whether or not the rechargeable battery is deteriorated with respect its performance.

However, the method disclosed in document 1 is not practically applicable for the reasons that such impedance-measuring instrument for measuring the impedance is required to have an alternate current-generating circuit and because of this, the apparatus involved unavoidably becomes large-sized, in addition, during when the rechargeable battery is operated, the measurement cannot be performed, and the measured impedance does not always coincide with the internal resistance component R detected as the magnitude of a voltage drop (IR loss) upon the charging-and-discharging operation.

Japanese Laid-open Patent Publication No. 2002-142379 (hereinafter referred to as document 2) discloses a method wherein internal resistance of a rechargeable battery is detected from the magnitude of a voltage drop upon the pulse-charging operation.

However, the method disclosed in document 2 has such problems as will be described in the following. A particular operation which is different from the operation adopted for ordinary charger is required. Although being different depending on the pulse width (the pulse time), in the pulse-charging, in general, a voltage build-up rate from the open-circuit voltage versus the charging current value in the charging region is lower in comparison with that in the case where the charging is being continuously operated and the battery voltage in the pausing region is not decreased until a prescribed open-circuit voltage, where when based on a voltage difference in this case, internal resistance of the rechargeable battery is detected, the value of the detected internal resistance becomes to be smaller than the internal resistance component R detected as the magnitude of a voltage drop (IR loss) upon operating the charging and discharging.

Japanese Laid-open Patent Publication No. Hei.7(1995)-240235 (hereinafter referred to as document 3) discloses a method wherein internal resistance of a rechargeable battery is detected from the magnitude of a voltage drop of the rechargeable battery which is measured by suspending the charging operation.

However, the method disclosed in document 3 has such problems as will be described in the following. A particular operation which is different from the operation adopted for ordinary charger is required, as well as in the case of the method disclosed in document 2. In addition, it is necessary to suspend the charging operation for a long period of time in order to precisely measure the magnitude of the voltage drop of the rechargeable battery, where the time required to full-charge the rechargeable battery is unavoidably elongated, and this invites inconvenience and lowers the working efficiency.

In order to solve such problems as described in the above, Japanese Laid-open Patent Publication No. 2002-50410 (hereinafter referred to as document 4) discloses a method for predictably detecting internal state of an inspective rechargeable battery with respect to electricity storable capacity, internal resistance, and the like from battery voltage of said battery and electric current flown therein by referring to previously acquired data of a normal rechargeable battery which corresponds to said inspective rechargeable battery, with respect to open-circuit voltage thereof which is expressed as function of electricity storable capacity thereof and internal resistance thereof which are expressed by functions of electricity storable capacity, battery temperature and current flow thereof. Although the method disclosed in document 4 is advantageous in that internal state of said inspective rechargeable battery can be predicted at an extremely high precision, there are disadvantages such that basic data of the rechargeable battery under various conditions are necessary to be acquired and a large amount of labor is required for the acquisition such data.

SUMMARY OF THE INVENTION

The present invention is aimed at solving the foregoing problems in the proposed methods in the prior art for detecting internal resistance of an inspective rechargeable battery.

Another object of the present invention relates to a detecting method and a detecting apparatus which enable one to efficiently detect internal resistance of a rechargeable battery at a high precision during when said rechargeable battery is being charged without necessity to use a particular operation during the charging operation and without consuming a particular time for the detection.

The inspective rechargeable battery includes a rechargeable battery pack having a rechargeable battery therein and which has a control circuit in which one or more of a switching element for charging which is capable of performing ON-OFF control, a switching element for discharging, and a detecting element for detecting a charge-and-discharge current value are accommodated in a charging-and-discharging path of said rechargeable battery.

A further object of the present invention is to provide a rechargeable battery pack which is added with said detecting apparatus A further object of the present invention is to provide an apparatus in which said detecting apparatus is provided.

A further object of the present invention is to provide a program in which said detecting method is incorporated and a medium in which said program is stored.

A typical embodiment of the detecting method of the present invention is a detecting method for detecting internal resistance of an inspective rechargeable battery when said inspective rechargeable battery is charged by a constant current-constant voltage charging regime comprising a constant current charging mode and a constant voltage charging mode in that charging is commenced by said constant current charging mode at a constant current value $I_0$ and after the battery voltage reaches a given voltage value $V_{max}$, the charging is performed by said constant voltage charging mode at a constant voltage $V_{max}$ until the termination thereof, characterized in that said detecting method comprises at least a step (a) wherein an accumulated, charged electricity quantity of said inspective rechargeable battery in the constant voltage charging mode is obtained and a step (b) wherein said charged electricity quantity of said inspective rechargeable battery obtained in the constant voltage charging mode in said step (a) is referred to previously acquired data of a normal rechargeable battery which corresponds to said inspective rechargeable battery, with respect to relationships between accumulated, charged electricity quantities thereof in the constant voltage charging mode and internal resistances thereof when increased or decreased or their increased or decreased magnitudes.

In the case where the electricity storable capacity of the inspective rechargeable battery is reduced to a magnitude of D time that of the normal rechargeable battery [where D is a constant of $0<D\leqq 1$], the detecting method may have a additional step between said step (a) and said step (b) wherein said charged electricity quantity of said inspective rechargeable battery obtained in the constant voltage charging mode in said step (a) is corrected by multiplying said charged electricity quantity by 1/D time and is referred to said relationship described in said step (b).

A typical embodiment of the detecting apparatus of the present invention is a detecting apparatus for detecting internal resistance of an inspective rechargeable battery when said inspective rechargeable battery is charged by a constant current-constant voltage charging regime comprising a constant current charging mode and a constant voltage charging mode in that charging is commenced by said constant current charging mode at a constant current value $I_0$ and after the battery voltage reaches a given voltage value $V_{max}$, the charging is performed by said constant voltage charging mode at a constant voltage $V_{max}$ until the termination thereof, said detecting apparatus having at least a means (i) for measuring a voltage of said inspective rechargeable battery, a means (ii) for acquiring an accumulated, charged electricity quantity of said inspective rechargeable battery in the constant voltage charging mode, a means (iii) for memorizing previously acquired data of a normal rechargeable battery which corresponds to said inspective rechargeable battery, with respect to relationships between accumulated, charged electricity quantities thereof in the constant voltage charging mode and internal resistances thereof when increased or decreased or their increased or decreased magnitudes, and a means (iv) for referring said charged electricity quantity of said inspective rechargeable battery in the constant voltage charging mode obtained by said means (ii) to information from said means (iii), wherein internal resistance of said inspective rechargeable battery is detected from information from said means (iv).

In the case where the electricity storable capacity of the inspective rechargeable battery is reduced to a magnitude of D time that of the normal rechargeable battery [where D is a constant of $0<D\leqq 1$], the detecting apparatus may have a further means for correcting said charged electricity quantity of said inspective rechargeable battery in the constant voltage charging mode by multiplying said electricity storable capacity by 1/D time prior to referring to said information from said means (iii).

The present invention also provides a rechargeable battery pack having one or more rechargeable batteries and which is added with said detecting apparatus.

The present invention further provides an apparatus having said detecting apparatus therein. Such apparatus can include an inspection equipment for inspecting a rechargeable battery whether the battery is good or defective, a charger for charging a rechargeable battery, portable instruments including a cellular phone, a personal digital assistant, and a portable type computer, and movable bodies including a motorcycle, an automobile, a ship, an aircraft, and a space craft.

The present invention still further provided a program for detecting internal resistance of an inspective rechargeable battery, in which said detecting method is incorporated, and a medium in which said program is stored.

The inspective rechargeable battery which is subjected to the detection of internal resistance thereof in the present invention includes rechargeable battery which are charged by the constant current-constant voltage charging regime. As specific examples of such rechargeable battery, there can be mentioned rechargeable lithium battery including lithium ion rechargeable battery in which oxidation-reduction reaction of lithium is used. However, the inspective rechargeable battery which is subjected to the detection of internal resistance thereof in the present invention is not limited to these rechargeable lithium battery.

Incidentally, unless otherwise specified, the term "constant voltage charging mode" in the description is an expression indicating a state wherein a rechargeable battery is being charged at a constant voltage or a case wherein a rechargeable battery is being charged at a constant voltage from the side of a non-controlled computer program. The "constant voltage charging mode" is the same meaning as that of the "state wherein a rechargeable battery is charged at a constant voltage". On the other hand, the term "constant current charging mode" means a state or a case wherein a rechargeable battery is being charged at a constant current value.

The "detection" of internal resistance of a rechargeable battery in the present invention is based on prediction.

BRIEF DESCRIPTION OF THE DRAWINGS

FIG. 2 shows a flow chart illustrating another embodiment of the detecting method for detecting internal resistance of a rechargeable battery in the present invention.

FIG. 9 is a schematic diagram of a circuit in which a resistor ($r_s$) is connected to a normal rechargeable battery whose internal resistance is $R_1$ in series connection to make said rechargeable battery into a rechargeable battery model with an increased internal resistance and a charger is connected to said rechargeable battery.

FIG. 10 shows an example of a graph exemplifying curves of changes in the charging voltage to charging time of the rechargeable battery shown in FIG. 9 when the rechargeable battery has charged by the constant current-constant voltage charging regime and wherein the resistance value of the resistor ($r_s$) has changed.

FIG. 11 shows an example of a graph exemplifying curves of changes in the charging current to charged electricity quantity (=charge capacity) of the rechargeable battery shown in FIG. 9 when the rechargeable battery has charged by the constant current-constant voltage charging regime and wherein the resistance value of the resistor ($r_s$) has changed.

FIG. 12 shows a graph exemplifying a curve of changes in the battery voltage of the rechargeable battery shown in FIG. 9 to elapsed time after the termination of the charging when the charging has terminated at the time of having reached a prescribed constant voltage in the constant current-constant voltage charging in the case wherein the resistor ($r_s$) was omitted.

DESCRIPTION OF THE INVENTION AND PREFERRED EMBODIMENTS

Figure 1:
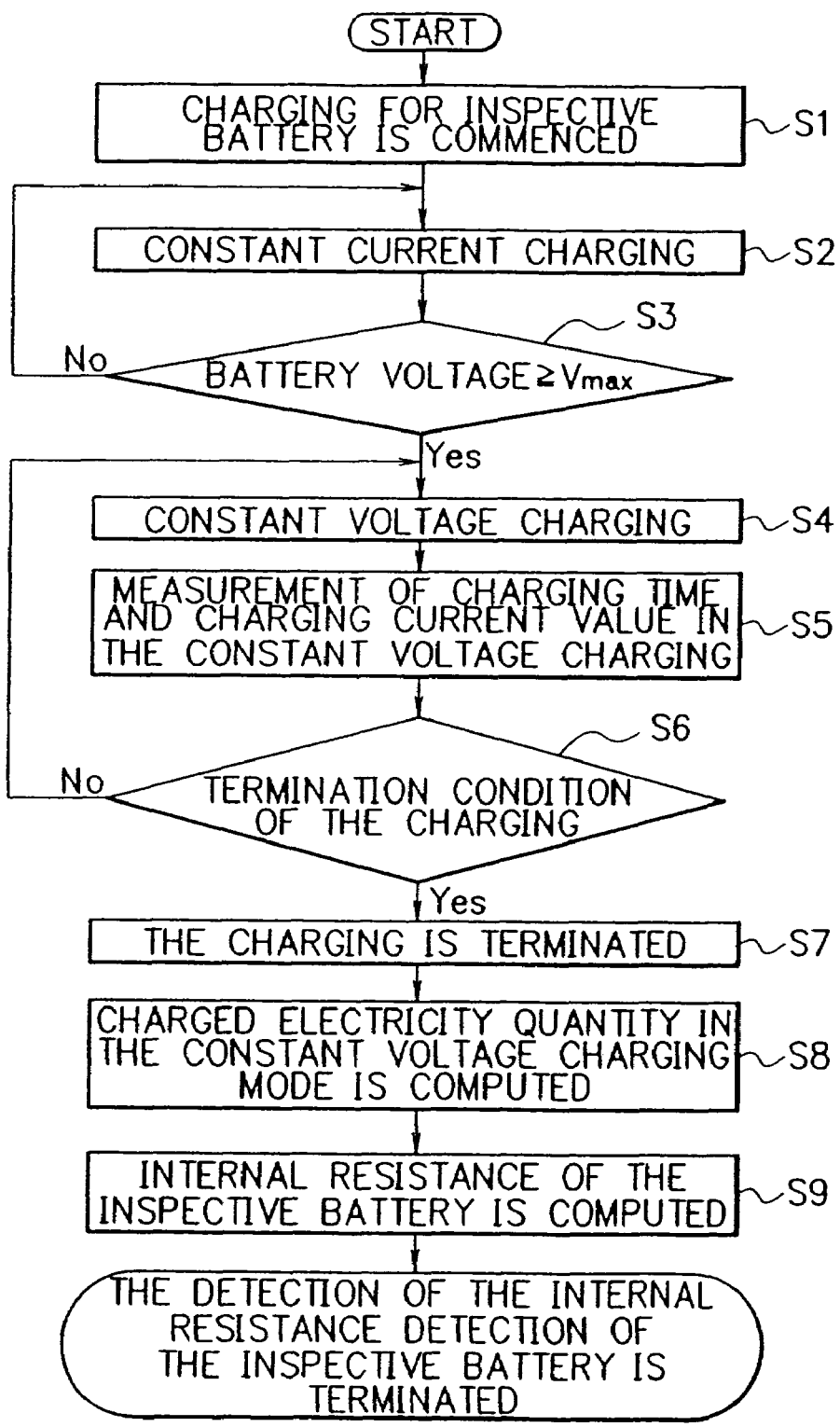
FIG. 1 shows a flow chart illustrating an embodiment of the detecting method for detecting internal resistance of a rechargeable battery in the present invention.

In the following, the present invention will be described in more detail.

As previously described, the detecting method of the present invention is typically a detecting method for detecting internal resistance of an inspective rechargeable battery when said inspective rechargeable battery is charged by a constant current-constant voltage charging regime comprising a constant current charging mode and a constant voltage charging mode in that charging is commenced by said constant current charging mode at a constant current value $I_0$ and after the battery voltage reaches a given voltage value $V_{max}$, the charging is performed by said constant voltage charging mode at a constant voltage $V_{max}$ until the termination thereof, characterized in that said detecting method comprises at least a step (a) wherein an accumulated, charged electricity quantity of said inspective rechargeable battery in the constant voltage charging mode is obtained and a step (b) wherein said charged electricity quantity of said inspective rechargeable battery obtained in the constant voltage charging mode in said step (a) is referred to previously acquired data of a normal rechargeable battery which corresponds to said inspective rechargeable battery, with respect to relationships between charged electricity quantities thereof in the constant voltage charging mode and internal resistances thereof when increased or decreased or their increased or decreased magnitudes.

In the case where the electricity storable capacity of the inspective rechargeable battery is reduced to a magnitude of D time that of the normal rechargeable battery [where D is a constant of 0<D≦1], the detecting method may have a additional step between said step (a) and said step (b) wherein said charged electricity quantity of said inspective rechargeable battery obtained in the constant voltage charging mode in said step (a) is corrected by multiplying said charged electricity quantity by 1/D time and is referred to said relationship described in said step (b).

The detecting apparatus of the present invention is typically a detecting apparatus for detecting internal resistance of an inspective rechargeable battery when said inspective rechargeable battery is charged by a constant current-constant voltage charging regime comprising a constant current charging mode and a constant voltage charging mode in that charging is commenced by said constant current charging mode at a constant current value $I_0$ and after the battery voltage reaches a given voltage value $V_{max}$, the charging is performed by said constant voltage charging mode at a constant voltage $V_{max}$ until the termination thereof, said detecting apparatus having at least a means (i) for measuring a voltage of said inspective rechargeable battery, a means (ii) for acquiring an accumulated, charged electricity quantity of said inspective rechargeable battery in the constant voltage charging mode, a means (iii) for memorizing previously acquired data of a normal rechargeable battery which corresponds to said inspective rechargeable battery, with respect to relationships of charged electricity quantities thereof in the constant voltage charging mode and internal resistances thereof when increased or decreased or their increased or decreased magnitudes, and a means (iv) for referring said charged electricity quantity of said inspective rechargeable battery in the constant voltage charging mode obtained by said means (ii) to information from said means (iii), wherein internal resistance of said inspective rechargeable battery is detected from information from said means (iv).

In the case where the electricity storable capacity of the inspective rechargeable battery is reduced to a magnitude of D time [where D is a constant of 0<D≦1] that of the normal rechargeable battery, the detecting apparatus may have a further means for correcting said charged electricity quantity of said inspective rechargeable battery in the constant voltage charging mode by multiplying said charged electricity quantity by 1/D time prior to referring to said information from said means (iii).

As previously described, the inspective rechargeable battery which is subjected to the detection of internal resistance thereof includes a rechargeable battery accommodated in a rechargeable battery pack having a control circuit in which one or more of a switching element for charging which is capable of performing ON-OFF control, a switching element for discharging, and a detecting element for detecting a charge-and-discharge current value are accommodated in a charging-and-discharging path of said rechargeable battery.

Description will be made of preferred embodiments of the detecting method of the present invention with reference to FIG. 1 and FIG. 2.

FIG. 1 shows a flow chart of an embodiment of the detecting method for detecting internal resistance of a rechargeable battery in the present invention, when said rechargeable battery is charged by the constant current-constant voltage charging regime (the CCCV charging regime) comprising a constant current charging mode and a constant voltage charging mode.

FIG. 2 shows a flow chart of another embodiment of the detecting method for detecting internal resistance of a rechargeable battery in the present invention, when said rechargeable battery is charged by the CCCV charging regime as well as in the embodiment shown in FIG. 1.

The embodiment shown in FIG. 2 is the same as that shown in FIG. 1, except that in the embodiment shown in FIG. 2, when the electricity storable capacity of the rechargeable battery (that is, the inspective rechargeable battery whose internal resistance is to be detected) is reduced to a magnitude of D time [where D is a constant of 0<D≦1] that of a normal rechargeable battery which corresponds to said inspective rechargeable battery, correction is performed for the inspective rechargeable battery with respect to the electricity storable capacity thereof.

It should be understood that the detecting method of the present invention is not restricted by these embodiments.

"S" of S1 to S9 in FIG. 1 and of S1 to S10 in FIG. 2 indicates "step" and the Arabic numeral of them indicates "step number".

First, description will be made of the detecting method according to the flow chart shown in FIG. 1.

As the start, there is provided an inspective rechargeable battery which is subjected to the detection of internal resistance thereof.

To charge the inspective rechargeable battery by the CCCV charging regime is commenced in Step 1. Particularly, the inspective rechargeable battery is charged by the constant current charging mode (Step 2).

At a time when the battery voltage of the inspective rechargeable battery reaches a prescribed voltage (Step 3), the constant current charging mode is shifted to the constant voltage charging mode (Step 4), where a charging current value and a charging time are measured (Step 5).

When the conditions to terminate the charging are satisfied (Step 6), the charging for the inspective rechargeable battery is terminated (Step 7).

In Step 8, a charged electricity quantity (=a charge capacity) of the inspective rechargeable battery by the constant voltage charging mode is computed from the charging current value and the charging time obtained in Step 5.

In Step 9, the charged electricity quantity of the inspective rechargeable battery which is obtained in Step 8 is referred to previously acquired data of a normal rechargeable battery (whose electricity storable capacity is not reduced) which corresponds to said inspective rechargeable battery, with respect to relationships between charged electricity quantities thereof in the constant voltage charging mode and internal resistances thereof when increased or decreased or their increased or decreased magnitudes, whereby internal resistance of the inspective rechargeable battery is detected.

The charged electricity quantity in the constant voltage charging mode and the internal resistance of the above-described rechargeable battery whose electricity storable capacity is not reduced have a correspondence of 1:1.

The reason which internal resistance of said rechargeable battery can be predicted by measuring a electricity quantity charged in the constant voltage charging mode is due to the following factors.

Here, the term "electricity storable capacity" equals to a full-charged electricity quantity and it indicates a maximum electricity quantity which a given battery can store therein. In the case of a rechargeable battery, the electricity storable capacity (=the full-charged electricity quantity) thereof means a total electricity quantity thereof which could be discharged until the discharge depth of 100% (that is, a state incapable of being further discharged). To be more specific, when the rechargeable battery is discharged from the full-charged state, the electricity storable capacity (=the full-charged electricity quantity) of the rechargeable battery equals to a value obtained by integrating changes in the discharging current value by the discharging time, namely, an area surrounded by a discharging current curve formed by plotting relationships of changes in the discharging current value versus changes in the discharging time and the discharging time axis.

Separately, in the case where the electricity quantity used in the charging is entirely (100%) stored in the rechargeable battery, an electricity quantity charged from the discharge depth of 100% until the full-charged state becomes to be the electricity storable capacity (=the full-charged electricity quantity) of the rechargeable battery.

In the charging by the constant current-constant voltage charging regime, the time point when the electricity quantity charged reaches a full-charged electricity quantity is a time point when the discharging current is substantially is stopped from flowing.

The electricity storable capacity (=the full-charged electricity quantity) of an inspective rechargeable battery whose electricity storable capacity is not reduced (not problematic if the internal resistance thereof has been increased) equals to that of a normal rechargeable which corresponds the inspective rechargeable battery. In this connection, in the case of an inspective rechargeable battery whose internal resistance alone is increased, the area of the inspective rechargeable battery which is surrounded by a discharging current curve formed by the discharging current value and the discharging time axis becomes to be substantially the same as that of the normal rechargeable battery.

In the case where an inspective rechargeable battery whose electricity storable capacity is not reduced but whose internal resistance is increased to be greater that of a normal rechargeable battery which corresponds said inspective rechargeable battery is charged by the constant current-constant voltage charging regime from the discharge depth of 100% until it becomes to be a full-charged state, in comparison with the normal rechargeable battery, the charging time of the inspective rechargeable battery in the constant current charging mode is short and the constant current charging mode is shifted to the constant voltage charging at early stage where the charging time in the constant voltage charging mode becomes relatively longer. This means that in the case of the rechargeable battery whose internal resistance is increased, the charged electricity quantity in the constant voltage charging mode until the time it is full-charged is increased as the internal resistance is increased. This indicates that for a given rechargeable battery whose electricity storable capacity is not reduced, when the charged electricity quantity thereof until the full-charged state in the constant voltage charging mode is previously known, it is possible to predict the internal resistance thereof. According to this method, even in the case where a rechargeable battery having a certain quantity of residual electricity therein is charged, namely, additionally charged, as long as the charging is started from the charging by the constant current charging mode, it is possible to predict the internal resistance thereof.

Now, in the detecting method of the present invention, because internal resistance of an inspective rechargeable battery is detected from the charged electricity quantity thereof in the constant voltage charging mode of the constant current-constant voltage charging regime (the CCCV charging regime), information relating to the charged electricity quantity thereof in the constant current charging mode from the discharge depth of 100% is not necessitated. That is, even in the case where the inspective rechargeable battery has a certain electricity quantity remained therein and the inspective rechargeable battery is intended to be additionally charged, the detecting method of the present invention makes it possible to detect the internal resistance thereof.

Unless otherwise specified, the "discharge depth of 100%" in the present invention means a state wherein substantially no electricity quantity can be outputted that is, a state wherein even when the discharging is continued further, the battery voltage is suddenly reduced and the electricity quantity capable of being outputted is substantially not changed.

[AQUISITION EXPERIMENTS OF DATA OF NORMAL RECHARGEABLE BATTERY, WITH RESPECT TO RELATIONSHIP BETWEEN CHARGED ELECTRICITY

QUANTITY N THE CONSTANT VOLTAGE CHARGING MODE AND INTERNAL RESISTANCE]

Description will be made of experiments in which data of relationships between charged electricity quantities of a given normal rechargeable battery in the constant voltage charging mode and internal resistances thereof when increased or decreased or their increased or decreased magnitudes for detecting internal resistance of a given inspective rechargeable battery could be acquired, with reference to FIGS. 9 to 12.

In the case of a rechargeable battery whose electricity storable capacity is not reduced but whose internal resistance alone is increased, in order to find out how the charging characteristics thereof will be changed, by using a model electric circuit in which a resistor $r_s$ is connected to a normal rechargeable battery in series connection to intentionally increase the internal resistance of the rechargeable battery and the rechargeable battery is charged by a constant current-constant voltage charging regime, where changes in the charging current value, changes in the charging voltage values and changes in the charged electricity quantity (=charge capacity) were observed. Then, after prescribed discharging operation was performed, the rechargeable battery was charged by the constant current charging mode, where internal resistance of the rechargeable battery when the charging voltage reached a prescribed voltage value was measured.

FIG. 9 is a schematic diagram of an electric circuit in which a resistor $r_s$ is electrically connected to a normal rechargeable battery (a portion surrounded by a broken line) having an internal resistance $R_1$ in series connection and a charger is electrically connected to said rechargeable battery. In this case, it is preferred that the resistance value of the resistor $r_s$ corresponds to a increased magnitude in the internal resistance of the rechargeable battery and is of substantially the same order as that of the internal resistance $R_1$ of the rechargeable battery.

FIG. 10 shows a graph of a case in that in FIG. 9, a commercially available lithium ion rechargeable battery whose nominal capacity is 1680 mAh and having a diameter of 18 mm and a height of 65 mm was used as the rechargeable battery and the lithium ion rechargeable battery was charged by the constant current-constant voltage charging regime, said graph exemplifying charging voltage curves of relationships between changes in the charging voltage value (V) and changes in the charging time (hour) when the rechargeable battery was charged at a constant current of 1.7 A from the discharge depth of 100% until the time when the charging voltage reached 4.2 V, successively the rechargeable battery was charged at a constant voltage of 4.2 V until the charging current was reduced to 0.1 A where the charging was terminated, for a case wherein the resistor $r_s$ was not connected to the lithium ion rechargeable battery, a case wherein a resistor $r_s$ of 27 mΩ was connected to the rechargeable battery, a case wherein a resistor $r_s$ of 39 mΩ was connected to the rechargeable battery, a case wherein a resistor $r_s$ of 62 mΩ was connected to the rechargeable battery, a case wherein a resistor $r_s$ of 91 mΩ was connected to the rechargeable battery, a case wherein a resistor $r_s$ of 110 mΩ was connected to the rechargeable battery, and a case wherein a resistor $r_s$ of 150 mΩ was connected to the rechargeable battery.

FIG. 11 shows a graph exemplifying charging current curves of relationships between changes in the charging current (A) and changes in the charged electricity quantity in FIG. 10.

FIG. 12 shows a graph exemplifying a battery voltage curve of relationships between changes in the battery voltage and changes in the elapsed time (for 90 minutes) since the termination of the charging in the case where no resistor $r_s$ was connected to the rechargeable battery wherein the rechargeable battery was charged at a constant charging current of 1.7 A from the discharge depth of 100% and the charging was terminated at the time when the charging current voltage reached 4.2 V in FIG. 10, in order to examine the open-circuit voltage when the charging voltage is 4.2 V.

From the charging voltage current curves to the charging time shown in FIG. 10, there was obtained a finding that as the resistance value of the resistor connected to the rechargeable battery in series connection is increased, the duration until the time when the charging voltage reaches a prescribed voltage value, namely, the charging time at a constant charging current value, is shortened and at early stage after the commencement of the charging, the constant current charging mode is shifted to the constant voltage charging mode.

From the charging current curves to the charged electricity quantity shown in FIG. 11, there were obtained the following findings. Although the charged electricity quantity in the constant voltage charging mode is increased as the resistance value of the resistor connected to the rechargeable battery in series connection is increased, the electricity quantity accumulated until the termination of the charging is in a range of from 1656 to 1670 mAh (which is 98.5% to 99.4% of the nominal capacity of the rechargeable battery) which is approximate to the electricity storable capacity.

Although it looks as if the resultant accumulated, charged electricity quantity would be decreased as the resistance of the connected resistor is increased, this is due to the reason that the charging was terminated at the time when the charging current value became to be 0.1 A. The attenuation of the charging current value in the constant voltage charging mode will be enlarged as smaller as the resistance of the connected resistor is. Because of this, in the case where the charging by the constant voltage charging mode should be continued for a sufficient period of time such that the charging current value becomes to be substantially zero, it is considered such that the accumulated, charged electricity quantity becomes to be substantially constant at a certain level regardless of the magnitude of the resistance of the connected resistor.

Therefore, even when the constant current-constant voltage charging operation is performed by artificially connecting a given resistor $r_s$ to the rechargeable battery in series connection to intentionally increase the internal resistance of the rechargeable battery, the electricity storable capacity of the rechargeable battery itself is substantially not changed.

From the battery voltage curve shown in FIG. 12, there was obtained a finding that after the termination of the constant current charging at a constant current value of 1.7 A, the battery voltage of the rechargeable battery is gradually decreased, and when a prescribed period of time elapses, the battery voltage is converged to a certain voltage value. This voltage value can be considered to be an open-circuit voltage (Voc) of the rechargeable battery.

Separately, from the battery voltage curve shown in FIG. 12, it is understood that the battery voltage is gradually decreased after the termination of the charging by the constant current charging at 1.7 A and when a prescribed period of time elapses thereafter, the battery voltage is converged to a certain voltage value. This voltage value is considered to be an open-circuit voltage. The battery voltage Vc upon the charging is expressed by the following equation (1) of the relationship between the open-circuit voltage Voc, the charging current I and the internal resistance R of the battery.

$$Vc = Voc + I \times R \quad (1)$$

When the internal resistance R of the rechargeable battery (the normal rechargeable battery) is made to be $R_1$, as the $R_1$ is a value obtained by dividing a difference between the charging voltage 4.2 and the open-circuit voltage at that time by the charging current value 1.7, the $R_1$ can be obtained in accordance with the following equation (2).

$$R_1 = (4.2\,V - Voc)/1.7(A) \quad (2)$$

The internal resistances $R\,(=R_1+r_s)$ also in each of the cases where various resistors $r_s$ whose resistance values being different one from the other were computed in accordance with the equation (2).

The results obtained in the above are collectively shown in Table 1. Particularly, in Table 1, there are shown the accumulated, charged electricity quantities (from the discharge depth of 100%) with respect to different resistance values based on the resistors connected to the battery when the charging current was decreased until 0.1 A; the accumulated, charged electricity quantities in the constant voltage charging mode (CV); the open-circuit voltages when the charging voltage reached 4.2 V, and the internal resistance values of the rechargeable battery computed from the equation (2). In table 1, the internal resistance value of the rechargeable battery is one obtained in the method in that the open-circuit voltage is measured and in accordance with the equation (2), the internal resistance value of the rechargeable battery or the rechargeable battery to which the resistor is connected is computed. In this case, if it is possible to use an external measuring equipment, the internal resistance value of the rechargeable battery can be directly measured by means of a LCR meter or the like.

Based on the results shown in Table 1, the relationship between the internal resistance and the charged electricity quantity in the constant voltage charging mode in each case was observed. The observed results are graphically shown in FIG. 13.

Figure 13:
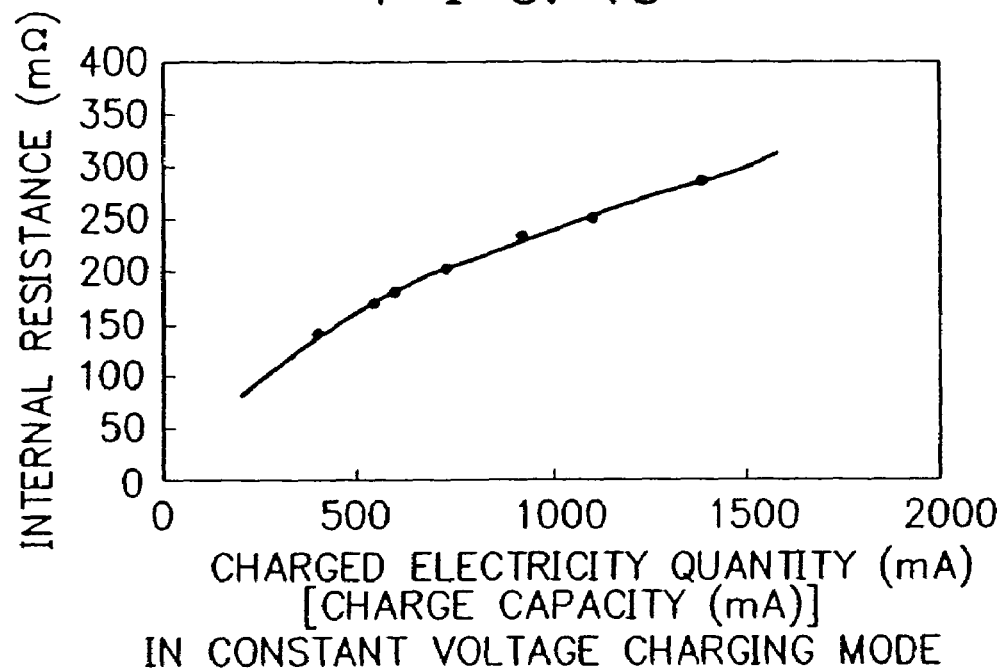
FIG. 13 shows an example of data a rechargeable battery with respect to relationship between charged electricity quantities thereof in the constant voltage charging mode and internal resistances thereof when increased or decreased or their increased or decreased magnitudes.

From FIG. 13, it is understood that various resistance values which were artificially established by connected the resistor having a different resistance to the rechargeable battery respectively has a correspondence of 1:1 with the charged electricity quantity.

From the results shown in Table 1, it is understood that the computed R value of the rechargeable battery to which the resistor is connected is substantially in agreement with the sum of the computed R value of the battery body and the resistance value of the resistor. To be more specific, the results shown in Table 1 indicate that it is not necessary to measure or compute the resistance value of the rechargeable battery to which the resistor is connected, as long as the resistance value of the battery body prior connecting the resistor thereto is obtained in advance, it is possible to readily compute the resistance value of the battery to which the resistor is connected from the resistance value of the connected resistor. Therefore, by previously acquiring data by measuring the internal resistance value of a normal rechargeable battery free from reduction in the electricity storable capacity and which corresponds the inspective rechargeable battery, subjecting the rechargeable battery to the charging by the constant current-constant voltage charging regime while connecting one of various resistors having a different resistance value to the rechargeable battery, and measuring the accumulated, charged electricity quantity in the constant voltage charging mode in each case, it is possible to predict internal resistance of the inspective rechargeable battery from the measurement of the accumulated, charged electricity quantity thereof in the constant charging mode in the case where the inspective rechargeable battery is free from reduction in the electricity storable capacity.

Here, it is possible to obtain a function formula R(Q) from an approximate curve of the relationship of the internal resistance R(mΩ) to the charged electricity quantity Q(mAh) in the constant voltage charging mode. The function formula R(Q) serves as a function of the charged electricity quantity Q in the constant voltage charging mode. It is presumed that the function formula R(Q) can be expressed by the following equation (3).

$$R(Q) = P_n \times Q^n + P_{n-1} \times Q^{n-1} + P_{n-2} \times Q^{n-2} + \ldots P_1 \times Q^1 + P_0 \times Q^0 \quad (3)$$

where $P_n$ to $P_o$ are constants which differ depending on the kind or type, the nominal capacity, or the like of a rechargeable battery used.

In this example, presuming that the internal resistance R is expressed by a tertiary polynomial of the charged electricity quantity Q in the constant voltage charging mode, based on previously acquired data of charging characteristics of a commercially available lithium ion rechargeable battery having a nominal capacity of 1680 mAh, a diameter of 18 mm and a height of 65 mm and from the curve-fitting in FIG. 13, there was obtained a function formula of the relationship R(Q) of the internal resistance R to the charged electricity quantity Q, which is expressed by the following tertiary polynomial (4).

$$R(Q) = [(0.000000072 \times Q^3) - (0.0002580011 \times Q^2)] + (0.4205795841 \times Q) + 7.825572664 \quad (4)$$

Data of the R(Q) can be acquired in accordance with the tertiary polynomial (4).

The data obtained in this way will be somewhat different depending on a rechargeable battery used. Therefore, it is preferred that for a plurality of rechargeable battery which are the same in terms of the kind and type, data of their R(Q) are obtained and the data obtained are averaged to be used.

In this example, the function formula of the relationship R(Q) is expressed by the tertiary polynomial, but this degree of the polynomial relating to the function formula of the relationship R(Q) is not limitative. Similarly, the function formula of the relationship R(Q) is not limited to such polynomial in the form of degree n.

Separately, in this example, the function formula of the relationship R(Q) is based on the approximate curve, but this is not limitative. It is possible that the relationship R(Q) is based on a data table.

In general, the electricity storable capacity of a rechargeable battery is gradually reduced due to the repetition of the charging-and-discharging cycle or a change with the passage of time. In the embodiment the detecting method of the present invention shown in the flow chart of FIG. 1, if the inspective rechargeable battery is a rechargeable battery whose electricity storable capacity is considered to be slightly reduced, internal resistance thereof can be detected (predicted) at a high precision. However, when the reduction rate in the electricity storable capacity is considered to relatively large, it is necessary to perform correction for the reduced magnitude as described in the flow chart shown in FIG. 2.

Description will be made of the detecting method according to the flow chart shown in FIG. 2.

The procedures from Step 1 until Step 8 in FIG. 2 are the same as those from Step 1 until Step 8 in FIG. 1, except for the following point.

That is, as previously described, the embodiment shown in FIG. 2 is the same as that shown in FIG. 1, except that in the embodiment shown in FIG. 2, the electricity storable capacity of the inspective rechargeable battery is considered to be reduced to a magnitude of D time [where D is a constant of 0<D≦1] that of the corresponding normal rechargeable battery, and because of this, correction is performed for the inspective rechargeable battery with respect to the electricity storable capacity.

Particularly, in the embodiment shown in FIG. 2, the charged electricity quantity of the inspective rechargeable battery obtained in Step 8 is corrected by multiplying said charged electricity quantity by 1/D time in Step 9. Then, as well as in the embodiment shown in FIG. 1, in Step 10 of FIG. 2, the charged electricity quantity (=charge capacity) corrected in this way is referred to previously acquired data of a normal rechargeable battery which corresponds to said inspective rechargeable battery, with respect to relationships between charged electricity quantities thereof in the constant voltage charging mode and internal resistances thereof when increased or decreased or their increased or decreased magnitudes, whereby internal resistance of the inspective rechargeable battery is detected.

Incidentally, as an example of the method capable of readily examining a reduction rate in the electricity storable capacity, there can be mentioned the following method. In the case where the charging for a rechargeable battery is performed by the constant current$I_0$-constant voltage $V_{max}$ charging mode, when for an inspective rechargeable battery whose electricity storable capacity is considered to be reduced, a time from shift time when the constant current charging mode at a constant current $I_0$ is shifted to the constant voltage charging mode at a constant voltage $V_{max}$ until the charging current reaches a prescribed current value $I_M$ is made to be $t_M'$ and a charged electricity quantity in the constant voltage charging mode is made to be $Q_{cv}'$, and for a normal rechargeable battery whose electricity storable capacity is not reduced and which corresponds said inspective rechargeable battery, said time is made to be $t_M$ and said charged electricity quantity is made to be $Q_{cv}$, the reduction rate D of said inspective rechargeable can be computed in accordance with the following relational expression (5).

$$D=(Q_{cv}'-I_0 \times t_M')/(Q_{cv}-I_0 \times t_M) \quad (5)$$

According to this equation (5), a reduction rare D of the electricity storable capacity of the inspective rechargeable battery can be computed when the electricity storable capacity of the normal rechargeable battery is set at 1.0.

In the case where the electricity storable capacity (=the full-charged electricity quantity) of the inspective rechargeable battery is D time (where D is a constant of 0<D≦1) that of the normal rechargeable battery, when the electricity storable capacity of the inspective rechargeable battery is corrected by multiplying it by 1/D, the corrected electricity storable capacity of the inspective rechargeable battery becomes to be in agreement with the electricity storable capacity of the normal rechargeable battery.

When the proportion of the discharged electricity quantity to the charged electricity quantity is 100%, the full-charged electricity quantity corresponds to a value obtained by accumulating charged electricity quantity from the discharge depth of 100% or integrating changes in the charging current value flown in the battery by the charging time, namely, an area surrounded by the charging current curve and the charging time axis.

Therefore, even in the case where the electricity storable capacity of the inspective rechargeable battery is unknown, the area surrounded by the charging current curve of the inspective rechargeable battery which is multiplied by 1/D time in a direction of the charging time axis and the charging time axis becomes to be equal to the area surrounded by the charging current curve of the normal rechargeable battery.

From the above-described relationships, the above-described equation (5) can be derived.

EXPERIMENTS

The present inventors conducted studies through experiments in order to accomplish the present invention. As a result, there were obtained experimental results as will be described in the following.

Based on these experimental results, the present inventors have accomplished the present invention that enables one to efficiently detect internal resistance of a rechargeable battery at a high precision during when said rechargeable battery is being charged without necessity to use a particular operation during the charging operation and without consuming a particular time for the detection.

The experimental results obtained by the present inventors will be explained with reference to respective figures.

Figure 3:
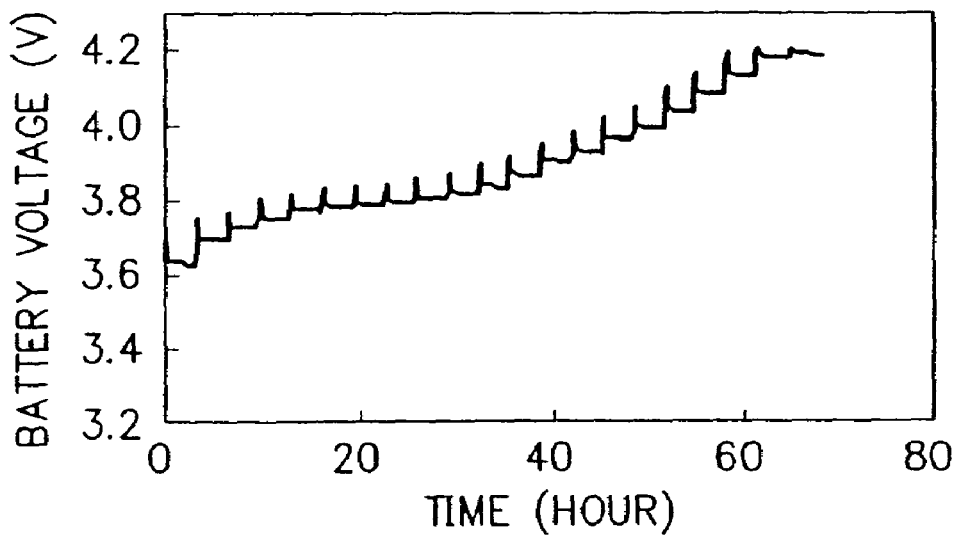
FIG. 3 shows a graph exemplifying charge characteristics of a rechargeable battery in the case where from the discharge depth of 100%, intermittent charging operation wherein said rechargeable battery is charged with a prescribed electricity quantity at a prescribed constant current value and thereafter, the rechargeable battery was full-charged.

FIG. 3 shows a graph exemplifying charge characteristics of a commercially available lithium ion rechargeable battery having a diameter of 18 mm, a length of 65 mm, and a nominal capacity of 1680 mAh in the case where from the discharge depth of 100%, intermittent charging operation wherein said lithium ion rechargeable battery is charged with an electricity quantity of 84 mAh (corresponding to 5% of the nominal capacity) at a constant current value of 0.34 A and thereafter, paused for 3 hours was repeated until the charging voltage reached 4.2 V, after the charging voltage having reached 4.2 V, the lithium ion rechargeable battery was charged at a constant charging voltage of 4.2 V, and the charging was terminated when the charging current value was decreased to a value of less than 0.1 A. In FIG. 3, the axis of abscissa indicates time (hour) and the axis of ordinates indicates battery voltage.

Figure 4:
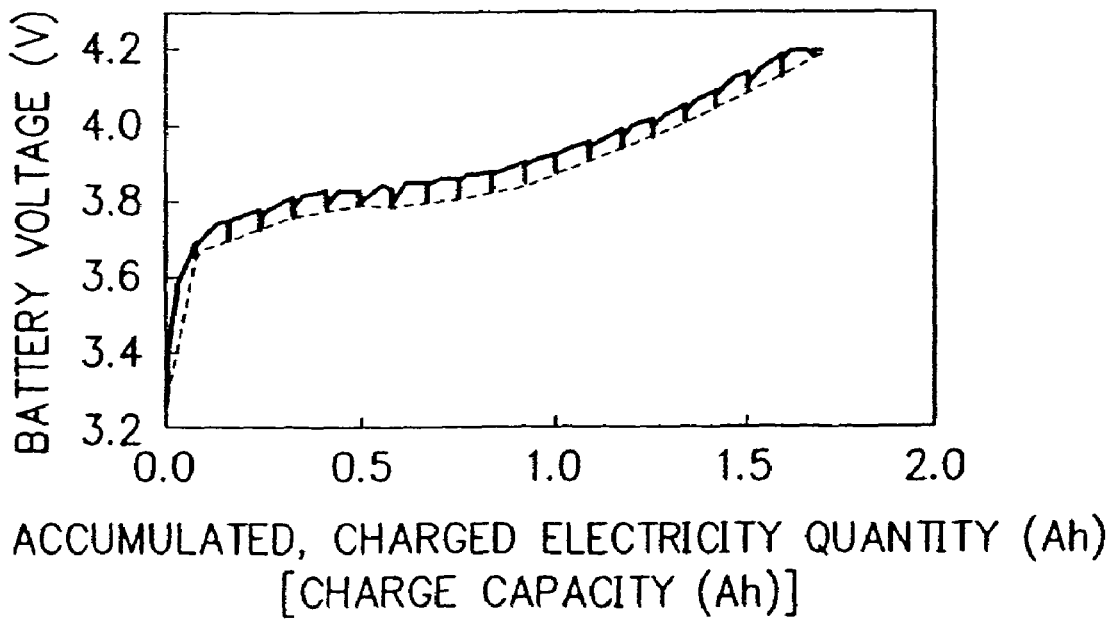
FIG. 4 shows a graph in which relationships of the battery voltages to the accumulated, charged electricity quantities which were obtained in FIG. 3 and relationships the battery voltages and open-circuit voltages which were obtained in FIG. 3 to said accumulated, charged electricity quantities are together illustrated.

FIG. 4 shows a graph of the accumulated, charged electricity quantities obtained in FIG. 3. Particularly, the graph of FIG. 4 illustrates relationships of changes in the battery voltage and changes in the open-circuit voltage upon the pausing times to said accumulated, charged electricity quantities.

In FIG. 4, the dotted line shows a traced result of the open-circuit voltages of the lithium ion rechargeable battery upon the pausing times and the solid line shows a traced result of the battery voltages of the lithium ion rechargeable battery upon the intermittent charging operations, where each spike portion indicates a point of time when the charging operation was suspended and the rechargeable battery was paused.

In FIG. 4, the accumulated, charged electricity quantity (=charge capacity) upon the termination of the charging was 1687 mAh which equals to the nominal capacity of the lithium ion rechargeable battery. Therefore, the voltage curve of the dotted line in FIG. 4 indicates relationship between the accumulated, charged electricity quantity (=the charge capacity) and the open-circuit voltage of the lithium ion rechargeable battery.

From FIG. 4, it is understood that the open-circuit voltage reflects the remaining capacity (=the presently stored electricity quantity) in the rechargeable battery. However, the open-circuit voltage does not depend on the internal resistance of the rechargeable battery. This means that even for the inspective rechargeable battery whose internal resistance is increased, the relationship between the remaining capacity and the open-circuit voltage with respect to the inspective rechargeable battery is substantially the same as that with respect to the normal rechargeable battery.

Figure 5:
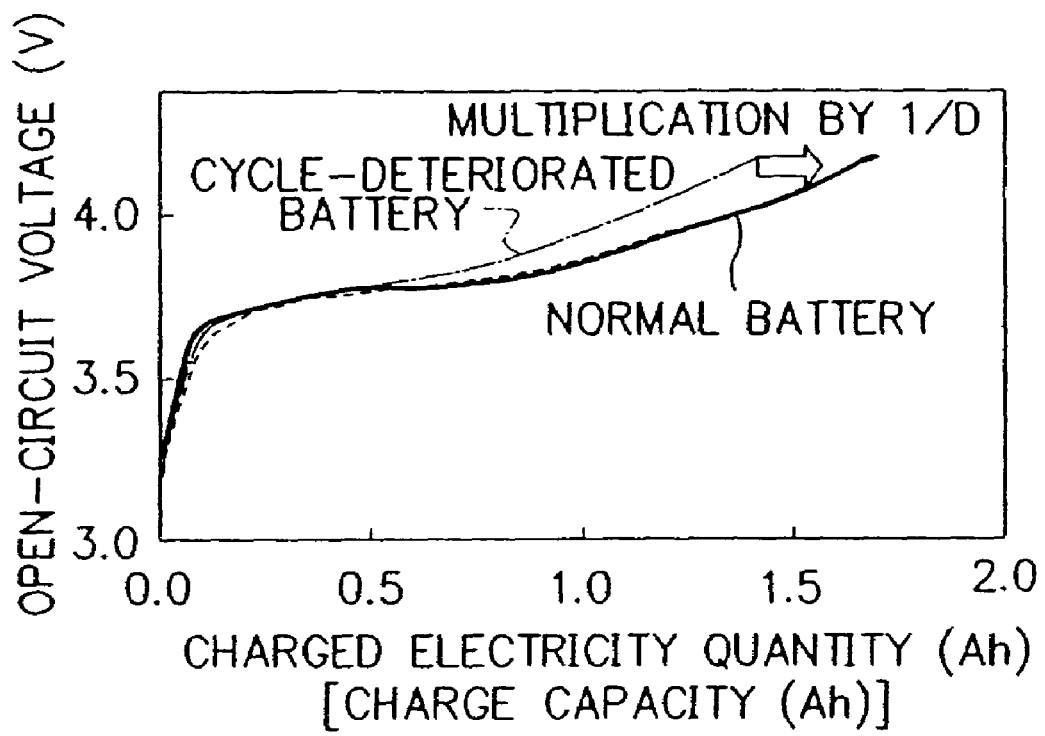
FIG. 5 shows a graph in which relationships between charged electricity quantities and open-circuit voltages of a normal rechargeable battery and relationships between charged electricity quantities and open-circuit voltages of a cycle-deteriorated rechargeable battery are together exemplified, and where when the open-circuit voltage curve cycle-deteriorated rechargeable battery is multiplied by 1/D (where D is a reduction rate in the electricity storable capacity) in a direction of the axis of abscissa (a direction of the charged electricity quantity), it will be in agreement with the curve of the normal rechargeable battery.

In FIG. 5, there is shown the dotted line of FIG. 4 by a solid line. Separately, for a normal lithium ion rechargeable battery of the same kind and the same type as the foregoing lithium ion rechargeable battery which has been previously cycle-deteriorated by repeating the intermittent charging-discharging operation 200 times, the acquired relationships between the charged electricity quantities and the open-circuit voltages in the same manner as in the case of FIG. 3 are also shown in FIG. 5 by a solid line and an alternate long and short dash line. The accumulated, charged electricity quantity (=charge capacity) of the cycle-deteriorated rechargeable battery was 1419 mAh. This means that the charged electricity quantity of the cycle-deteriorated rechargeable battery is reduced to 0.84 (=1419/1687) time the nominal capacity of the normal rechargeable battery before it was cycle-deteriorated.

FIG. 5 also shows a dotted line obtained by multiplying the accumulated, charged electricity quantities which fall in the abscissa of the voltage curve (the alternate long and short dash line) by 1/0.84 (=1.19).

As FIG. 5 illustrates, the dotted line is substantially agreed with the voltage curve (the solid line) of the relationships between the accumulated, charged electricity quantities and the open-circuit voltages of the normal rechargeable battery. Therefore, for the inspective rechargeable battery whose electricity storable capacity is deteriorated to be D time [where D is a constant of $0<D\leq 1$] that of the normal rechargeable battery, it is possible to make the voltage curve of the charged electricity quantity and the open-circuit voltage with respect to the inspective rechargeable battery to be in agreement with that of the normal rechargeable battery by multiplying the electricity storable capacity of the deteriorated rechargeable battery by 1/D time, regardless of the internal resistance thereof. In other words, for an inspective rechargeable battery whose electricity storable capacity is deteriorated to be D time [where D is a constant of $0<D\leq 1$] that of the normal rechargeable battery, by multiplying the characteristic of the inspective rechargeable battery which can be expressed as a linear function of the remaining capacity by 1/D time, it is possible to indicate the characteristic of the normal rechargeable battery or the inspective rechargeable battery whose internal resistance alone is changed.

Figure 6:
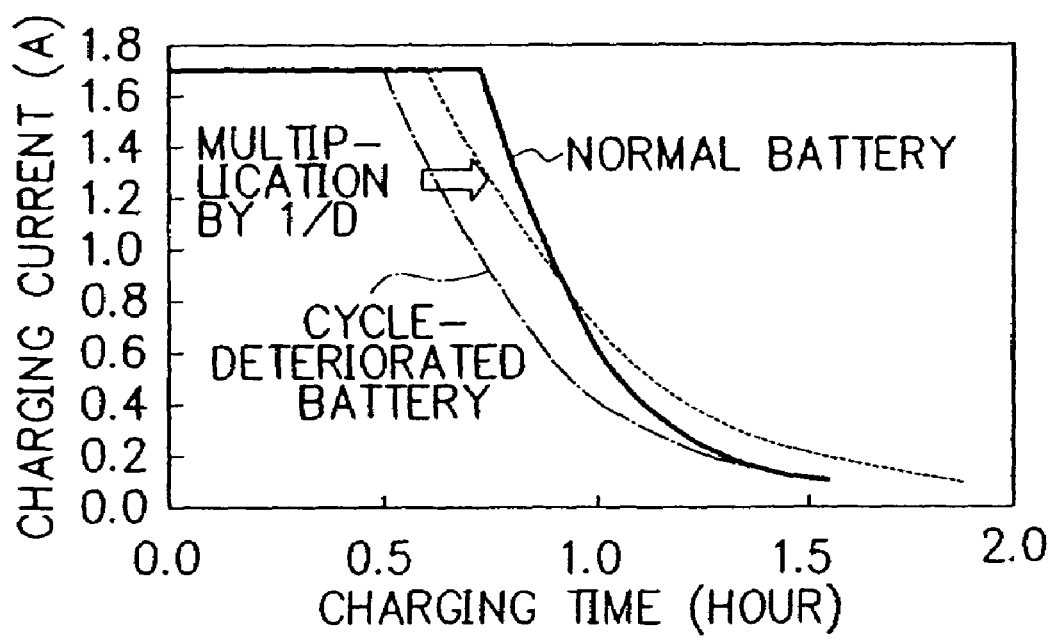
FIG. 6 shows a graph in which relationships between charging times of a normal rechargeable battery in the constant current-constant voltage charging and charging current values of said normal rechargeable battery and relationships between charging times of a cycle-deteriorated rechargeable battery in the constant current-constant voltage charging and charging current values of said cycle-deteriorated rechargeable battery are together exemplified, and where relationships between charging times obtained by multiplying said charging times of said cycle-deteriorated rechargeable battery by 1/D (=1/0.84=1.19) and said charging current values of said cycle-deteriorated rechargeable battery are plotted.

FIG. 6 shows a graph exemplifying charge characteristics of each of the above-described normal rechargeable battery and the above-described cycle-deteriorated rechargeable battery when each of them was subjected to the constant current-constant voltage charging at a constant charging current of 1.7 A and a maximum charging voltage of 4.2 V from the discharge depth of 100% until the charging current value in the constant voltage charging mode became to be a value of less than 0.1 A, where the charge characteristics of the normal rechargeable battery are shown by a solid line and the charge characteristics of the cycle-deteriorated rechargeable battery are shown by an alternate long dash line.

FIG. 6 also shows a dotted line obtained by multiplying the axis of abscissa (the charging time) of the alternate long dash line of the cycle-deteriorated rechargeable by 1/D time, that is, 1/0.84 (=1.19).

In FIG. 6, the axis of abscissa indicates the charging time (hour) and the axis of ordinates indicates the charging current value.

The area surrounded by the charging current curve and the charging time axis of the cycle-deteriorated rechargeable battery (that is, the inspective rechargeable battery) in FIG. 6 corresponds to the charged electricity quantity. Thus, in the case where the electricity storable capacity of the inspective rechargeable battery is decreased to a magnitude of D time [where D is a constant of $0<D\leq 1$] that of the normal rechargeable battery which corresponds to said inspective rechargeable battery, the area surrounded by the charging current curve and the charging time axis of the inspective rechargeable battery becomes to be D time that of the normal rechargeable battery.

This situation indicates that when the charging current curve of the inspective rechargeable battery whose electricity storable capacity is decreased to a magnitude of D time that of the normal rechargeable battery is multiplied by 1/D time [where D is a constant of $0<D\leq 1$] in a direction of the charging time axis and the area surrounded by the charging current curve and the charging time axis of the inspective rechargeable battery is multiplied by 1/D time, the electricity storable capacity of the inspective rechargeable battery becomes to be substantially the same as that of the normal rechargeable battery. And as will be understood also from the comparison of the solid line with the dotted line in FIG. 6, although the area (the full-charged electricity quantity) surrounded by the charging current curve which is corrected by multiplying by 1/D time and the charging time axis does not differ from that of the normal rechargeable battery, the discharging curve of the former battery is not in agreement with that of the latter battery. Thus, it is possible to convert the charging current curve of the inspective rechargeable battery into a charging current curve where only the internal resistance, which increases the charged electricity quantity in the constant voltage charging mode, is increased.

Therefore, in the case of an inspective rechargeable battery whose electricity storable capacity is decreased to a magnitude of D time [where D is a constant of $0<D\leq 1$] that of a normal rechargeable battery which corresponds to said inspective rechargeable battery, by multiplying the charged electricity quantity of the inspective rechargeable battery in the constant voltage charging mode by 1/D time and referring to previously acquired data of said normal rechargeable battery with respect to relationships between charged electricity quantities thereof in the constant voltage charging mode and internal resistances thereof when increased or decreased or their increased or decreased magnitudes, it is possible to detect internal resistance of the inspective rechargeable battery.

The value of D (that is, the D value) in the present invention corresponds to a ratio of the electricity storable capacity of an inspective rechargeable battery (b) to that of a normal rechargeable battery (a) which corresponds to said inspective rechargeable battery (b).

The D value can be obtained in the following manner. First, for the normal rechargeable battery and the inspective rechargeable battery, a full-charged electricity quantity C for the normal rechargeable battery (a) and that C' for the inspective rechargeable battery (b), or a total discharged electricity quantity C from the full-charged state until the discharge depth of 100% for the normal rechargeable battery and that C' for the inspective rechargeable battery are measured. Then, a ratio (C'/C) of the full-charged electricity quantity C' (=electricity storable capacity) of the inspective rechargeable battery to the full-charged electricity quantity C (=electricity storable capacity) of the normal rechargeable battery is computed to obtain a D value=C'/C. In this case, it is possible that the full-charged electricity quantity C of the normal rechargeable battery is replaced by the nominal capacity.

Besides, in the case where the charging is performed by the constant current ($I_0$)-constant voltage ($V_{max}$) charging regime, for the normal rechargeable battery and the inspective rechargeable battery, a time $t_M$ from the time when the constant current ($I_0$) charging mode is shifted to the constant voltage ($V_{max}$) charging mode until reaching a prescribed current value ($I_M$) for the normal rechargeable battery and that $t_M{}'$ for the inspective rechargeable battery are measured, and in addition, a charged electricity quantity $Q_{cv}$ in the constant voltage charging mode for the normal rechargeable battery and that $Q_{cv}{}'$ for the inspective rechargeable battery are measured, and in accordance with the foregoing equation (5), that is, $D=(Q_{cv}{}'-I_0 \times t_M{}')/(Q_{cv}-I_0 \times t_M)$, there can be obtained a D value.

Here, it is more preferred that aforesaid prescribed current value $(I_M)$ is ½ of the constant current $(I_O)$ Now, the above-described equation (5) can be derived by using the factor that the area surrounded by a charging current curve obtained by multiplying the charging current curve of the rechargeable battery whose electricity storable capacity is reduced in FIG. 6 by 1/D time in a direction of the charging time axis is equal to the area surrounded by the charging current curve of the normal rechargeable battery and the charging time axis.

According to the latter method, the D value can readily computed at a high precision by using information of the charging current value and the charged electricity quantity in the constant voltage charging mode of the constant current-constant voltage charging regime (the CCCV charging regime), without necessity to practically measure the full-charged electricity quantity.

[Charged Electricity Quantity in the Constant Voltage Charging Mode]

As the charged electricity quantity in the constant voltage charging mode of the CCCV charging regime in the present invention, it is possible to use a charged electricity quantity until reaching to one of the following three time points (1) to (3) from the time point when the constant current charging mode is shifted to the constant voltage charging mode.

(1) A time point when the charging current value in the constant voltage charging mode has been sufficiently decreased to a prescribed current value $(I_{min})$.

(2) A time point when a prescribed time $(t_n)$ has elapsed since the time when the charging current value in the constant voltage charging mode reached a prescribed current value $(I_n)$.

(3) A time point when a prescribed time $(t_f)$ has elapsed since the time when the constant current charging mode was shifted to the constant voltage charging mode. The prescribed time $(t_f)$ herein means a time when the charging current value becomes to be sufficiently small, and which is a value decided by the previously conducted test. Separately, in the case of the charging by the CCCV charging regime, it is possible that an elapsed time since the time when the charging by the constant current charging mode was commenced is made to be the prescribed time $(t_f)$.

It is possible that any of the conditions described in the above (1) to (3) is made to be termination condition of the charging in the detecting method of the present invention.

The reason why the charged electricity quantity in the constant voltage charging mode at any of the above described time points (1) to (3) can be considered as the charged electricity quantity in the constant voltage charging mode until reaching the full-charged state is due to the following factor. That is, at any of the time points (1) to (3), the charging current has already become to be sufficiently small. Therefore, after that time point, if the charging should be further continued until the time when the charging current becomes to be substantially zero, an increase in the charged electricity quantity is slight. This only exerts a slight influence (a slight erroneous difference) to the detection of internal resistance of an inspective rechargeable battery in the present invention and which can be disregarded.

[Detecting Apparatus]

In the following, an embodiment of the detecting apparatus for detecting internal resistance of a rechargeable battery in the present invention will be described with reference to the drawing.

Incidentally, said rechargeable battery whose internal resistance is detected by the detecting apparatus of the present invention includes a rechargeable battery in a rechargeable battery pack having said rechargeable battery and having a control circuit in which one or more of a switching element for charging which is capable of performing ON-OFF control, a switching element for discharging, and a detecting element for detecting a charge-and-discharge current value are accommodated in a charging-and-discharging path of said rechargeable battery.

Figure 7:
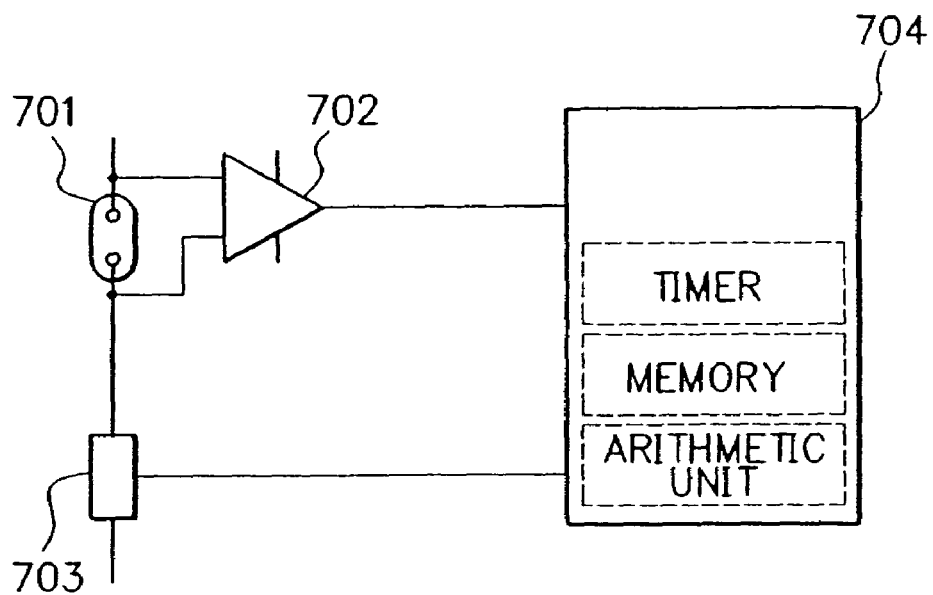
FIG. 7 is a schematic diagram illustrating an example of an electric circuit as a principal constitution portion of the detecting apparatus for detecting internal resistance of a rechargeable battery in the present invention.

FIG. 7 is a schematic diagram illustrating an embodiment of an electric circuit as a principal constitution portion of the detecting apparatus of the present invention for detecting internal resistance of an inspective rechargeable battery when said inspective rechargeable battery is charged by the constant current-constant voltage charging regime (the CCCV charging regime). It should be understood that this embodiment is only for illustrative purpose and it can be optionally modified in many ways within a range where the principle of the present invention is not hindered.

Description will be made of the detecting apparatus shown in FIG. 7.

The electric circuit constitution of the detecting apparatus of the present invention basically comprises a pair of terminals 701 for connecting an inspective rechargeable battery to the apparatus body, a battery voltage-detecting portion 702 for detecting a voltage between a pair of terminals (an inter-terminal voltage) of the inspective rechargeable battery, a charging current-detecting portion 703 for detecting a charging current of the inspective rechargeable battery, and a control portion 704. The pair of terminals 701 serve to readily and surely electrically connect the inspective rechargeable battery with the apparatus body.

The battery-voltage detecting portion 702 serves to detect an inter-terminal voltage between the anode and the cathode of the inspective rechargeable battery with a high input impedance, where information of the detected voltage is outputted from the battery-voltage detecting portion 702 into the control portion 704.

The charging current-detecting portion 703 serves to detect a charging current of the inspective rechargeable battery is detected with a low input impedance, where information of the detected charging current is outputted from the charging current-detecting portion 703 into the control portion 704.

The control portion 704 has a timer (a counter) and an arithmetic unit in the inside or the outside thereof.

Based on the voltage information supplied from the battery-voltage detecting portion 702, the control portion 704 functions to shift from the constant current charging mode to the constant voltage charging mode.

A charging duration since the shift time is measured by the timer (the counter). Based on the information of the charging current supplied from the charging current-detecting portion 703 and the charging duration supplied the timer (the counter) of the control portion 704, a charged electricity quantity (=a charge capacity) of the inspective rechargeable battery is obtained by the arithmetic unit of the control portion 704.

The control portion 704 also has a memory as a memory means in the inside or the outside thereof. In the memory means of control portion 704, previously acquired data of a corresponding normal rechargeable battery, with respect to relationships between charged electricity quantities thereof in the constant voltage charging mode and internal resistances thereof when increased or decreased or their increased or decreased magnitudes, are memorized in advance. Said normal rechargeable battery is the same as the inspective rechargeable battery in terms of the type and kind.

In the control portion 704, the arithmetic unit functions to computer internal resistance of the inspective rechargeable battery-by referring the measured, charged electricity quantity of the inspective rechargeable battery in the constant voltage charging mode to information of the relationships of charged electricity quantities versus internal resistances of the normal rechargeable battery from the memory means.

The detecting apparatus of the present invention in this embodiment may be singly operated by connecting to the inspective rechargeable battery for which the charging by the CCCV charging regime is performed. For the power source necessitated for the apparatus body at this time, nothing is described in the figure, but it is possible to design such that the power source is supplied from the outside. In the alternative, it is possible to be supplied from a charger or the inspective rechargeable battery, which is connected to the apparatus body.

[Rechargeable Battery Pack]

Figure 8:
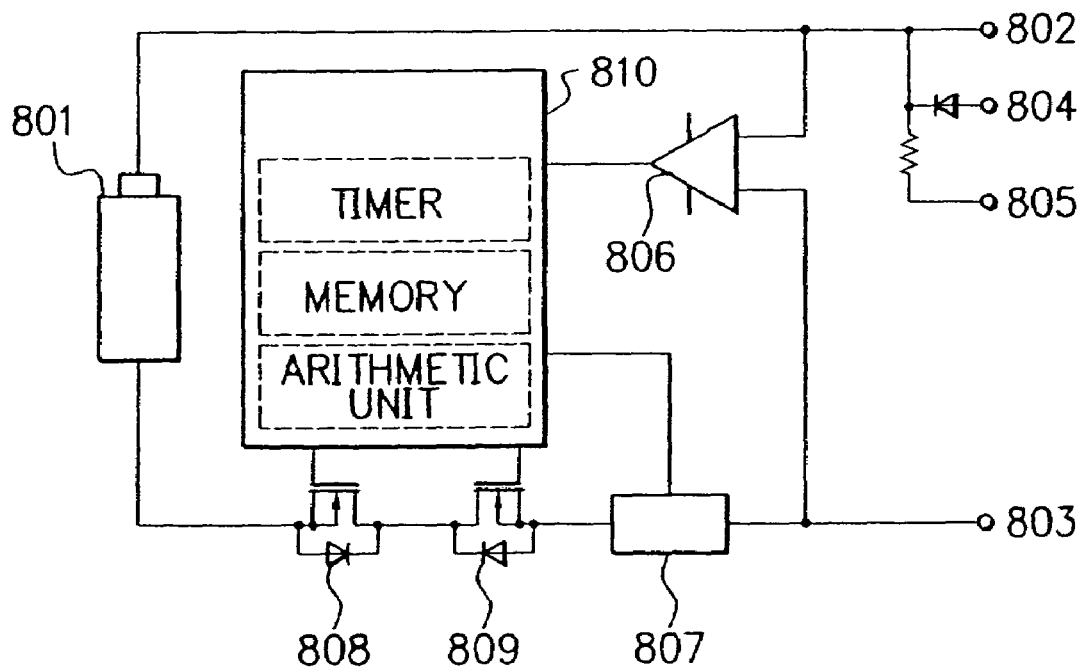
FIG. 8 is a schematic diagram illustrating an example of a rechargeable battery pack which is added with the detecting apparatus for detecting internal resistance of a rechargeable battery in the present invention.

FIG. 8 is a schematic diagram illustrating an embodiment of an electric circuit constitution of a rechargeable battery pack in which a combination of the detecting apparatus having the electric circuit shown in FIG. 7 and a rechargeable battery (801) is installed.

The circuit constitution of the detecting apparatus shown in FIG. 8 is a partial modification of the circuit constitution shown in FIG. 7. Therefore, here, description will be made of the constitution not shown in FIG. 7.

It is possible that the detecting apparatus (for detecting internal resistance of the rechargeable battery (801) as an inspective rechargeable battery) in the rechargeable battery pack is connected to the pair of terminals 701 shown in FIG. 7 through the positive and negative terminals of the rechargeable battery pack, which are used for charging the rechargeable battery (801).

The rechargeable battery pack shown in FIG. 8 has aforesaid rechargeable battery 801, a positive terminal 802 and a negative terminal 803 of the rechargeable battery pack, a charging positive terminal 804 (the negative terminal 803 is capable of serving also as a charging negative terminal), a battery voltage monitor output terminal 805, a battery voltage-detecting portion 806 for detecting a voltage between a pair of terminals (an inter-terminal voltage) of the rechargeable battery pack, a charging current-detecting portion 807 for detecting a charging current value in the rechargeable battery pack, an overdischarge prevention element 808 and an overcharge prevention element 809 respectively for the rechargeable battery 801 in the rechargeable battery pack, and a control portion 810 which is the same as the control portion 704 in FIG. 7.

Each of the overdischarge prevention element 808 and the overcharge prevention element 809 may comprise MOS provided with a parasitic diode, FET or the like.

The rechargeable battery pack shown in FIG. 8 has only one rechargeable battery installed therein. This is for the simplification purpose and not limitative. The rechargeable battery pack may have a plurality of rechargeable battery installed therein.

The battery voltage-detecting portion 806 functions to detect a voltage between the positive and negative terminals (802, 803) of the rechargeable battery as an inspective rechargeable battery, where this voltage information is outputted into the control portion 810. The charging current-detecting portion 807 functions to detect a charging current value in the rechargeable battery pack, where this current value information is outputted into the control portion 810. The control portion 810 functions basically in the same way as the control portion 704 does as previously explained in the case of FIG. 7, except for performing the ON-OFF control for the overdischarge prevention element 808 and the overcharge prevention 809, to detect internal resistance of the rechargeable battery pack as the inspective rechargeable battery.

[Apparatus Having the Detecting Apparatus of the Present Invention Therein]

It is possible that the detecting apparatus of the present invention represented by the detecting apparatus shown in FIG. 7 is accommodated in a charger. In this case, information of the internal resistance of the rechargeable battery in the charger may be indicated or outputted to the outside.

It is also possible that the detecting apparatus of the present invention represented by the detecting apparatus shown in FIG. 7 is accommodated in other apparatus bodies in which a rechargeable battery is used as the power source. By accommodating the detecting apparatus in such apparatus, it is possible to extend the operation time to the maximum by properly controlling the power outputted from the rechargeable battery depending on internal resistance of the battery on the side of the apparatus in which the rechargeable battery is accommodated, or it is possible to avoid occurrence of sudden stall of the operation by previously knowing the time necessary to exchange the rechargeable battery based on internal resistance relating to the lifetime of the rechargeable battery.

As specific examples of such apparatus whose performance can be improved in such a way as above described by accommodating the detecting apparatus therein, there can be mentioned a cellular phone, a personal digital assistant, a portable type computer, and movable bodies including a motorcycle, an automobile, a ship, an aircraft, and a space craft.

Besides, as other apparatus (or a system) whose performance can be improved by accommodating the detecting apparatus of the present invention therein, there can be mentioned, for example, inspection instruments for inspecting whether a rechargeable battery product is good or not good, and power storage systems.

Incidentally, it is possible to make the detecting apparatus of the present invention have versatility by inputting information of the characteristics of each of a plurality of normal rechargeable battery whose kinds are the same but whose types are different one from the other (for instance, a plurality of normal lithium ion rechargeable battery whose kinds are the same but whose types are different one from the other, a plurality of normal nickel-metal hydride rechargeable battery whose kinds are the same but whose types are different one from the other, a plurality of normal nickel-cadmium rechargeable battery whose kinds are the same but whose types are different one from the other, or a plurality of normal lead-acid rechargeable battery whose kinds are the same but whose types are different one from the other) into the memory means thereof.

The detecting apparatus in this case is preferred to be provided with a type selection means for selecting a normal rechargeable battery type which is suitable for detecting internal resistance of a given inspective rechargeable battery in the detecting apparatus. The type selection means in this case may have, for instance, a switch-inputting function or an inputting function by a wire or radio electric signal or an optical signal.

In this case, it possible to detect internal resistance of a given inspective rechargeable battery which is charged by the constant current-constant voltage charging regime, regardless of the kind or type thereof, by making such that previously acquired data of relationships between charged electricity quantities and internal resistances for plural kinds of normal rechargeable batteries are memorized in the memory means and information of said data of the normal rechargeable battery which is corresponding to said inspective rechargeable battery is selected by aforesaid type selection means.

Thus, according to the present invention, it is possible to detect internal resistance of an inspective rechargeable battery of any kind. Although description has been made of lithium ion rechargeable batteries in the above examples, this is not limitative. The inspective rechargeable battery in the present invention can include other different kinds of rechargeable batteries such as nickel-metal hydride rechargeable batteries, nickel-cadmium rechargeable batteries, and lead-acid rechargeable batteries.

[Program for Detecting Internal Resistance of Inspective Rechargeable Battery]

The present invention provides a program for detecting internal resistance of an inspective rechargeable battery. The program of the present invention comprises a program obtained by programming the detecting method of the present invention which is represented by the flow chart shown in FIG. 1 or FIG. 2. Said program contains previously acquired data of a normal rechargeable battery corresponding to an inspective rechargeable battery, with respect to relationships between charged electricity quantities there of in the constant voltage charging mode and internal resistances thereof when increased or decreased or their increased or decreased magnitudes.

In the case of an apparatus in which an rechargeable is used as the power source and which has a control portion, it is possible to make said apparatus have the detection function according to the present invention to detect internal resistance of said rechargeable battery by making the control portion of said apparatus to have aforesaid program of the present invention together with previously acquired data of a normal rechargeable battery, which corresponds to said rechargeable battery provided in said apparatus, with respect to relationships between charged electricity quantities thereof in the constant voltage charging mode and internal resistances thereof when increased or decreased or their increased or decreased magnitudes.

For instance, in the case of a portable type personal computer which is used by connecting a rechargeable battery, it has a principal control portion which is mainly engaged in the operation of the apparatus body and a secondary control portion which is mainly engaged in the exchange with peripheral devices, where the secondary control portion functions to monitor information of current value or/and voltage value from a rechargeable battery as the power source.

It is possible to make said personal computer have the detection function according to the present invention to detect internal resistance of said rechargeable battery so that the precision of the power source control of the apparatus is improved, by making the secondary control portion or the principal control portion of said personal computer to have the program of the present invention together with acquired data of a normal rechargeable battery, which corresponds to said rechargeable battery provided in said personal computer, with respect to relationships between charged electricity quantities thereof in the constant voltage charging mode and internal resistances thereof or increased or decreased internal resistance magnitudes thereof. In this case, the use efficiency of the presently stored energy of the rechargeable battery is optimized so as to make the apparatus exhibit the performance to the maximum.

[Memory Medium in which the Program of the Present Invention is Stored]

The present invention provides a memory medium in which the above-described program is stored. Particularly, in the memory medium of the present invention, a program obtained by programming the detecting method of the present invention represented by the flow chart shown in FIG. 1 or FIG. 2 and previously acquired data of a normal rechargeable battery, which corresponds to an inspective rechargeable battery, with respect to relationship between charged electricity quantities thereof in the constant voltage charging mode and internal resistances thereof when increased or decreased or their increased or decreased magnitudes are memorized.

Further, the memory medium may contain a program for computing a reduction rate in the electricity storable capacity of a given rechargeable battery and data necessary for the computation which are memorized therein.

The memory medium of the present invention can be used in an apparatus having a charging function so as to have a function to detect internal resistance of a rechargeable battery used therein by connecting the memory medium thereto.

Such apparatus can include, for example, chargers, video cameras, digital cameras, cellular phones, personal digital assistants, computers, and vehicles such as electric vehicles and hybrid powered automobiles, respectively having a power source comprising a rechargeable battery.

Even in the case where a change is occurred in the type or/and the kind of the rechargeable battery used, correction for the change can be readily performed by providing an adequate memory medium capable of complying with the change, where precise detection of internal resistance of the rechargeable battery can be performed.

[Aquisition Example of Data of Correction Coefficient for the Discharged Electricity Quantity at Battery Temperature T and Discharging Current $I_d$ with Respect to Internal Resistance]

The internal resistance of a rechargeable battery will be changed depending on the battery temperature and also depending on the discharging current, and following this change in the internal resistance, the presently stored electricity quantity (the remaining capacity) capable of being discharged will be changed.

Therefore, for instance, in the case where for an instrument in which a rechargeable battery is used as the power source, an operative time during which said instrument is capable of being operated is intended to estimate, the operative time is difficult to be more precisely estimated only from information of the internal resistance and the reduction rate in the electricity storable capacity (the remaining capacity) of the rechargeable battery which are obtained by the foregoing method according to the present invention.

In order to make it possible to more precisely estimate the operative time during which the instrument is capable of being operated, it is preferred to acquire data of correction coefficient for the relationship between the internal resistance and the discharged electricity quantity at a battery temperature T and a discharging current I with respect to the rechargeable battery in the instrument. Said data may be acquired, for instance, in the following manner.

That is, first, the internal resistance of a normal rechargeable battery, which corresponds the rechargeable battery in the instrument as the inspective rechargeable battery, is presumed to be $R_1$ at a battery temperature $T_0$ (=25° C. or normal temperature), and the internal resistance of the inspective rechargeable battery which is obtained according to the detecting method of the present invention is presumed to be $R'=R_1+r_s$. Here, the correction coefficient for the discharged electricity quantity for a given rechargeable battery is decided by the internal resistance R thereof at a battery temperature T and a discharging current and it can be expressed by $f_{1\_T, i}(R)$.

In this respect, a total discharged electricity quantity of the normal rechargeable battery whose internal resistance is $R_1$ can be expressed by $C_d = C_N \times f_{\_T, i}(R_1)$ and a total discharged electricity quantity of the inspective rechargeable battery whose correction coefficient for a reduction rate in the electricity storable capacity is D can be expressed by $C_d' = C_N \times f_{\_T, i}(R')$.

When for the instrument in which said inspective rechargeable battery is used as the power source, an average consumption electric current thereof is made to be i and an average consumption power thereof is made to be p; an average discharging voltage of said normal rechargeable battery when it is discharged at a discharging current value i is made to be $V_m$; and an average discharging voltage of said inspective rechargeable battery when it is discharged at a discharging current value i is made to be $V_m'$; the operative time h during which said instrument is capable of being operated is computed in accordance with an equation $h = C_d'/i$ or $h = (V_m' \times C_d')/P$, where $V_m' = V_m - i \times (R - R_1) = V_m - i \times r_s$.

In the following, for an inspective rechargeable battery whose electricity storable capacity is $C_N$ after the internal resistance thereof has been detected (predicted) to be R', an example of a method of acquiring data of correction coefficient for the discharged electricity quantity (that is, the discharge capacity) of said inspective rechargeable battery at a battery temperature T and a discharging current $I_d$ will be described.

In the case where the inspective rechargeable battery is a rechargeable battery whose electricity storable capacity has not changed (reduced) but whose internal resistance alone has increased, in order to find out how the characteristics with respect to the discharge capacity thereof at a battery temperature T and a discharging current $I_d$ will be changed, a resistor $r_s$ was connected to said rechargeable battery in series connection to intentionally increase the internal resistance thereof and the rechargeable battery was charged by the constant current-constant voltage charging regime, and thereafter, the rechargeable battery was discharged at a prescribed battery temperature T and a prescribed discharging current $I_d$, where the charged electricity quantity (the charge capacity) was observed. Then, the rechargeable battery was charged by the constant current charging mode until the time when the charging voltage reached a prescribed voltage value, where internal resistance of the rechargeable battery was measured.

This procedure was performed in accordance with the previously described method with reference to FIG. 9.

Particularly, as previously described, FIG. 9 is a schematic diagram of an electric circuit in which a resistor $r_s$ is electrically connected to a normal rechargeable battery having an internal resistance $R_1$ in series connection and a charger is electrically connected to said rechargeable battery. As the normal rechargeable battery in FIG. 9, there was provided a commercially available lithium ion rechargeable battery having a nominal capacity of 1680 mAh, a diameter of 18 mm and a height of 65 mm. This lithium ion rechargeable battery was used in the manner shown in following seven cases: a case wherein no resistor $r_s$ is connected to the lithium ion rechargeable battery; a case wherein a resistor $r_s$ of 27 mΩ is connected to the rechargeable battery; a case wherein a resistor $r_s$ of 39 mΩ is connected to the rechargeable battery; a case wherein a resistor $r_s$ of 62 mΩ is connected to the rechargeable battery; a case wherein a resistor $r_s$ of 91 mΩ is connected to the rechargeable battery; a case wherein a resistor $r_s$ of 110 mΩ is connected to the rechargeable battery; and a case wherein a resistor $r_s$ of 150 mΩ is connected to the rechargeable battery. In each of these seven cases, the rechargeable battery was charged by the constant current-constant voltage charging regime. Particularly, the rechargeable battery was charged at a constant current of 1.7 A from the discharge depth of 100% until the time when the charging voltage reached 4.2 V, successively the rechargeable battery was charged at a constant voltage of 4.2 V until the charging current was reduced to 0.1 A in the constant voltage charging mode. Thereafter, the rechargeable battery was discharged at a battery temperature of 25° C. and a discharging current value of 1.7 A until the time when the battery voltage became to be 3.0 V, where the discharged electricity quantity (the discharge capacity) was measured. After this, the rechargeable battery was charged by the constant current charging mode at a constant current value of 1.7 A, where the battery voltage [the open-circuit voltage (Voc)] at the time when the charging voltage reached 4.2 V was measured. Then, using this Voc, internal resistance R of the rechargeable battery was computed in accordance with the foregoing equation (2).

The computed internal resistance values (mΩ) in the respective cases are shown in Table 2 together with the discharged electricity quantities (mAh), and ratios of them to the nominal capacities in the respective cases.

Based on the results shown Table 2, relationship between the internal resistance R and a ratio of the discharged electricity quantity (the discharge capacity) [until the time when the battery voltage (=the open-circuit voltage) reached 3.0 V at 25° C. (the battery temperature) and 1.7 A (the discharging current value)] to the nominal capacity (1680 mAh) was obtained for each case. The results obtained are graphically shown in FIG. 14.

Here, it is possible to consider that the relationship between the internal resistance R and a ratio of the discharged electricity quantity (the discharge capacity) [until the time when the battery voltage reached 3.0 V at 25° C. and 1.7 A] to the nominal capacity serves as a correction coefficient for the discharged electricity quantity (the discharge capacity). In this respect, it is possible to consider that the correction coefficient can be expressed as a function of the internal resistance R by the following equation (6).

$$f_{\_25° C., 1.7A}(R) = G_n \times R^n + G_{n-1} \times R^{n-1} + \ldots G_1 \times R^1 + G_0 \times R^0 \quad (6)$$

In the equation (6), $G_n$ to $G_0$ are constants which differ depending on the kind or type, the nominal capacity, or the like of a rechargeable battery used.

Figure 14:
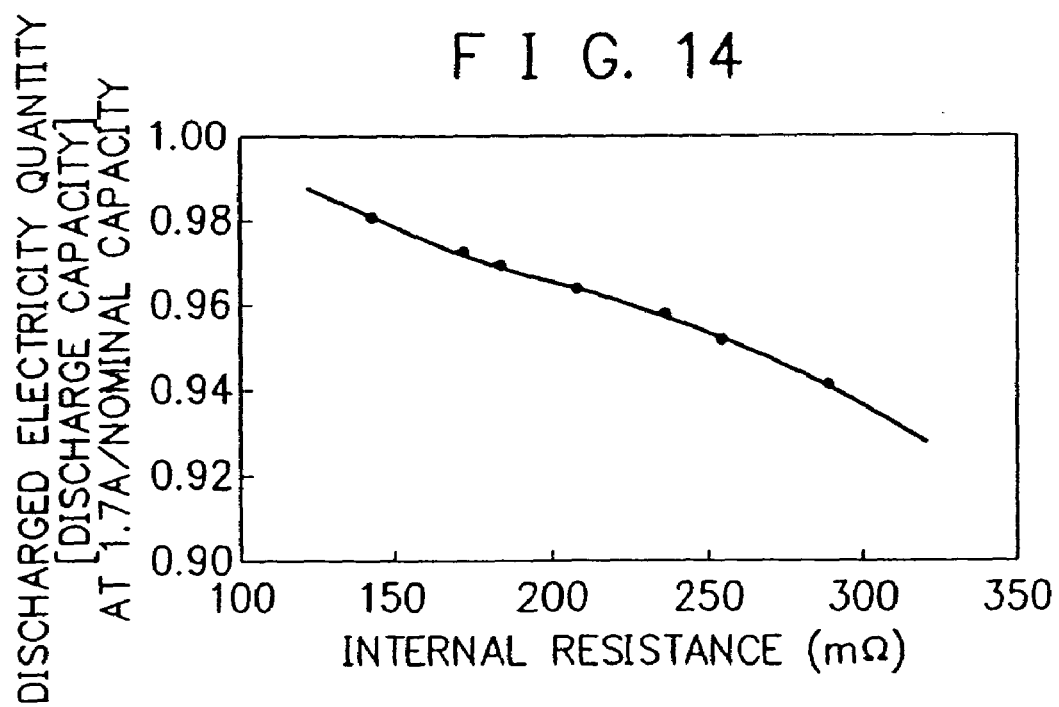
FIG. 14 shows an example of data relating to correction efficiency for charged electricity quantity (=charge capacity) of a rechargeable battery which is obtained at a prescribed battery temperature T (=25° C.) and a prescribed charging current I(=1.70A) to internal resistance of said rechargeable battery.

In this example, presuming that the discharge capacity correction coefficient is expressed by a tertiary polynomial of the internal resistance R, based on previously acquired data of charging characteristics of a commercially available lithium ion rechargeable battery having a nominal capacity of 1680 mAh, a diameter of 18 mm and a height of 65 mm and from the curve-fitting in FIG. 14, there was obtained a function formula of the discharge capacity correction coefficient as the relationship between the internal resistance R and the ratio of the discharged electricity quantity (the discharge capacity) [until the time when the battery voltage reached 3.0 V at 25° C. (the battery temperature) and 1.7 A (the discharging current value)] to the nominal capacity, which is expressed by the following tertiary polynomial (7).

$$f\_{25°C,1.74}(R)=[(-0.0000000068 \times R^3)+ \\ (0.0000041892 \times R^2)]+(-0.0010928023 \times R)+ \\ 1.0698074090 \quad (7)$$

Data of the $f\_{25°C,1.74}(R)$ can be acquired in accordance with the tertiary polynomial (7).

The data obtained in this way will be somewhat different depending on a rechargeable battery used. Therefore, it is preferred that for a plurality of rechargeable battery which are the same in terms of the kind and type, data of their $f\_{25°C,1.74}(R)$ are obtained and the data obtained are averaged to be used.

In this example, the function formula of the relationship between the internal resistance R and the ratio of the discharged electricity quantity (the discharge capacity) [until the time when the battery voltage reached 3.0 V at 25° C. (the battery temperature) and 1.7 A (the discharging current value)] to the nominal capacity is expressed by the tertiary polynomial, but this degree of the polynomial relating to the function formula of aforesaid relationship is not limitative. Similarly, the function formula of the relationship is not limited to such polynomial in the form of degree n.

Separately, in this example, the data of the relationship of the discharge capacity correction coefficient at the battery temperature T and the discharging current value $I_d$ to the internal resistance have been explained as the function formula based on the approximate curve, but this is not limitative. It is possible that aforesaid relationship is based on a data table.

As described in the above, the relationship of the charged electricity quantity (=the charge capacity) to the internal resistance R or a increased or decreased magnitude thereof and the relationship of the discharge capacity correction coefficient at the battery temperature T and the charging current value $I_d$ to the internal resistance are not limited respectively to the function formula obtained from the previously measured data.

For instance, as such function formula, it is possible to use a function formula obtained by way of simulation on the basis of information of the cathode and anode of a normal rechargeable battery, their composition, thickness, density, size or like others and information of the electrolyte solution or the battery structure of said rechargeable battery. Separately, it is possible to use an empirical formula based on a number of measured data from various rechargeable battery in deteriorated mode state. However, these methods are not practical because various rechargeable battery in deteriorated mode state are necessary to be provided in advance, adjustment and analysis of a number of data are necessitated, and a huge amount of labor is required to do so.

Therefore, it is preferred that data of the relationship of the charged electricity quantity (=the charge capacity) in the constant voltage charging mode versus the internal resistance or the increased or decreased magnitude thereof and data of the correction coefficient, namely, the relationship of the discharged electricity quantity (=the discharge capacity) at the battery temperature T and the discharging current value $I_d$ to the internal resistance, are acquired in accordance with the previously described method with reference to FIG. 9 in which to a normal rechargeable battery having internal resistance value $R_1$, a plurality of resistors $r_s$ each having a prescribed resistance value which is of substantially the same order as that of the internal resistance $R_1$ of said rechargeable battery are separately connected, whereby the internal resistance R of said rechargeable battery is intentionally increased.

In the following, the present invention will be described in more detail with reference to examples. It should be understood that these examples are only for illustrative purposes and the present invention is not restricted by these examples.

EXAMPLE 1

In this example, the effectiveness of the detecting method of the present invention was examined by the following manner.

There were provided (a) a commercially available normal lithium ion rechargeable battery having a nominal capacity of 1680 mAh, a diameter of 18 mm and a height of 65 mm and (b) an inspective rechargeable battery whose electricity storable capacity is considered be free from reduction and which is of the same kind and type as the normal rechargeable battery (a).

For the normal rechargeable battery (a), data of the relationships of charged electricity quantities (charge capacity) thereof to internal resistances thereof when increased or decreased or an increased or decreased magnitude thereof in the constant voltage charging mode of the constant current-constant voltage charging regime had been previously acquired in accordance with the previously described method with reference to FIG. 9.

Following the flow chart shown in FIG. 1, the inspective rechargeable battery (b) was charged by the constant current-constant voltage regime and internal resistance of the inspective rechargeable battery (b) was detected (predicted). After this, an actual internal resistance of the inspective rechargeable battery (b) was measured.

The effectiveness of the detecting method of the present invention was examined by comparing the detected internal resistance with the actual internal resistance.

Particularly, the inspective rechargeable battery (b) was charged by the constant current charging mode at a constant current value of 1.7 A until the time when the charging voltage reached 4.2 V, following this, the inspective rechargeable battery (b) was charged by the constant voltage charging mode at 4.2 V, where the charging was terminated when the charging current was decreased to 0.1 A, and a charged electricity quantity of the inspective rechargeable battery (b) in the constant voltage charging mode was computed from the measured current values during the charging by the constant voltage charging mode.

Then, the charged electricity quantity of the inspective rechargeable battery (b) was substituted in the foregoing function formula (4) of the relationship R(Q) of the internal resistance R to the charged electricity quantity Q, obtained from aforesaid data of the normal rechargeable battery (a) with respect to the relationship of the charged electricity quantity thereof to the internal resistance thereof when increased or decreased or the increased or decreased magnitude of said internal resistance, whereby internal resistance the inspective rechargeable battery (b) was detected (predicted)

After this, the inspective rechargeable battery (b) was discharged at a constant current value of 0.17 A until a final voltage of 3.0 V, and thereafter, the inspective rechargeable battery (b) was charged by the constant current charging mode at a constant current value of 1.7 A and the charging by this constant current charging mode was terminated when the charging voltage reached 4.2 V, then after a prescribed period of time elapsed, the open-circuit voltage (=the battery voltage) of the inspective rechargeable battery (b) was measured, and in accordance with the foregoing equation (1), internal resistance of the inspective rechargeable battery (b) was computed.

The results obtained in the above are collectively shown in Table 3.

In Table 3, the value of the charged electricity quality by CV is a charged electricity quantity (an accumulated, charged electricity quantity by the constant current charging mode, the value of the detected internal resistance is a predicted internal resistance value obtained by the detecting method of the present invention, the value of the open-circuit voltage is a battery voltage value at the time when the prescribed period of time elapsed after the termination of the charging, and the value of the computed internal resistance is a internal resistance value computed from the open-circuit voltage Voc obtained as being Vc=4.7 and I=1.7 in the foregoing equation (1).

From the results shown in Table 3, an erroneous difference between the detected internal resistance value [145.4 (mΩ)] and the internal resistance value [144.1 (mΩ)] (computed based on the open-circuit voltage) of the inspective rechargeable battery (b) was computed as follows.

$$|1145.4-144.1|/144.1 \times 100 = 0.9(\%) \quad (8)$$

Thus, said erroneous difference was found to be 0.9%.

From this result, it is understood that according to the detecting method of the present invention, it is possible to readily detect internal resistance of an inspective rechargeable battery at a high precision from a measured value of a charged electricity quantity of the inspective rechargeable battery in the constant voltage charging mode, without necessity of performing a particular operation during the constant current-constant voltage charging regime or consuming a particular period of time for the detection.

EXAMPLE 2

As well as in the case of Example 1, there were provided (a) a normal rechargeable battery comprising commercially available normal lithium ion rechargeable battery having a nominal capacity of 1680 mAh, a diameter of 18 mm and a height of 65 mm and (b) an inspective rechargeable battery comprising a rechargeable battery which is of the same kind and type as the normal rechargeable battery (a).

For the normal rechargeable battery (a), data of the relationship of the charged electricity quantity (charge capacity) thereof to the internal resistance thereof when increased or decreased or an increased or decreased magnitude of said internal resistance in the constant voltage charging mode of the constant current-constant voltage charging regime had been previously acquired in accordance with the previously described method with reference to FIG. 9. Said data includes data obtained from the foregoing function formula (4) relating to the relationship R(Q) of said internal resistance (R) (including an increased or decreased magnitude of said internal resistance) to said charged electricity quantity (Q).

For the inspective rechargeable battery (b), it was cycle-deteriorated by subjecting to repetition of the charging and discharging cycle 160 times.

Following the flow chart shown in FIG. 2, the cycle-deteriorated inspective rechargeable battery (b) was charged by the constant current-constant voltage regime and internal resistance thereof was detected (predicted). After this, an actual internal resistance of the inspective rechargeable battery (b) was measured.

The effectiveness of the detecting method of the present invention was examined by comparing the detected internal resistance with the actual internal resistance.

Particularly, the inspective rechargeable battery (b) was charged by the constant current charging mode at a constant current value 1.7 A until the time when the charging voltage reached 4.2 V, following this, the inspective rechargeable battery (b) was charged by the constant voltage charging mode at 4.2 V, where the charging was terminated when the charging current was decreased to 0.1 A, and a charged electricity quantity ($Q_{cv}'$) of the inspective rechargeable battery (b) in the constant voltage charging mode was computed. Then, after the charged electricity quantity ($Q_{cv}'$) of the inspective rechargeable battery (b) was multiplied by 1/D time [D is a reduction rate in the electricity storable capacity of the inspective rechargeable battery (b)], the value obtained by multiplying the charged electricity quantity by 1/D was substituted in the Q of the foregoing function formula (4) [which is of the relationship R(Q) between the internal resistance R (including an increased or decreased magnitude of said internal resistance) to the charged electricity quantity Q in the constant current charging mode], the data obtained from function formula (4) being included in aforesaid data of the normal rechargeable battery (a), whereby internal resistance (R) of the inspective rechargeable battery (b) was detected (predicted).

After this, the inspective rechargeable battery (b) was discharged at a constant current value of 0.17 A until a final voltage of 3.0 V, and thereafter, the inspective rechargeable battery (b) was charged by the constant current charging mode at 1.7 A and the charging by this constant current charging mode was terminated when the charging voltage reached 4.2 V, then after a prescribed period of time elapsed, the open-circuit voltage (V) of the inspective rechargeable battery (b) was measured, and in accordance with the foregoing equation (1), internal resistance (R) of the inspective rechargeable battery (b) was computed.

The results obtained in the above are collectively shown in Table 4.

From the results shown in Table 4, an erroneous difference between the detected internal resistance value [203.6 (mΩ)] and the internal resistance value [205.9 (mΩ)] (computed based on the open-circuit voltage) of the inspective rechargeable battery (b) was computed as shown in the following equation (9).

$$|203.6-205.9|/205.9 \times 100 = 1.1 \; (\%) \quad (9)$$

Thus, said erroneous difference was found to be 1.1%.

Here, the reduction rate D in the electricity storable capacity of the inspective rechargeable battery (b) in Table 4 is a value obtained in the following manner.

In the above charging operation for the inspective rechargeable battery (b), a duration ($t_M'$) from the time when the constant current charging mode at 1.7 A was shifted to the constant voltage charging mode at 4.2 V until the time when the charging current value in the constant voltage charging mode became to be a prescribed value of 0.85 A and a charged electricity quantity ($Q_{cv}'$) in the constant voltage charging mode were measured. Here, the duration ($t_M$) and the charged electricity quantity ($Q_{cv}$) of the normal rechargeable battery (a) are known from the previously acquired data thereof which are used in the equation (5). Thus, by substituting said $Q_{cv}'$ and $t_M'$ for the inspective rechargeable battery (b) and said $Q_{cv}$ and $t_M$ for the normal rechargeable battery (b) in the foregoing equation (5), there was obtained a D value.

The results obtained are collectively shown in Table 5.

Here, because the $I_0$ in the equation (5) is a charging current value of 1.7 A in the constant current charging mode, the D value as the reduction rate in the electricity storable capacity of the inspective rechargeable battery (b) can be computed in accordance with the following equation (10).

$$D = (0.6231 - 1.7 \times 0.308)/(0.4038 - 1.7 \times 0.170) \quad (10)$$

Now, the effectiveness of the detecting method of the present invention was examined by comparing a case wherein internal resistance of the inspective rechargeable battery is predictively detected without using the detecting method of the present invention with a case wherein the open-circuit voltage of the inspective rechargeable battery is measured and internal resistance thereof is computed in accordance with the foregoing equation (1) and comparing the time consumed in order to obtain the internal resistance in the former case and that in the latter case.

Figure 15:
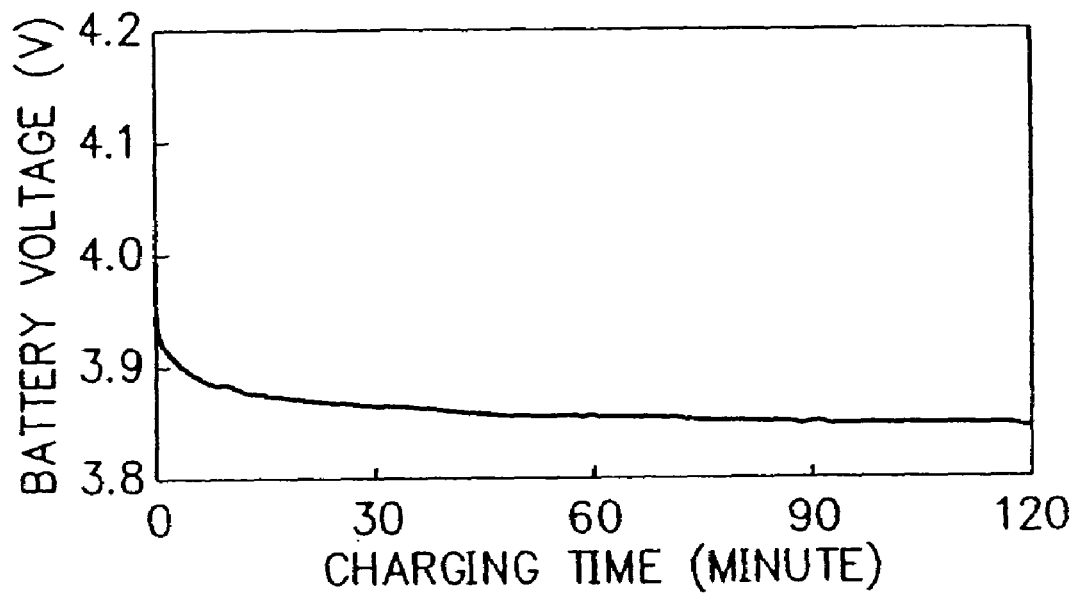
FIG. 15 shows a graph exemplifying a curve of changes in the battery voltage of a cycle-deteriorated rechargeable battery to elapsed time after the termination of the charging for said cycle-deteriorated rechargeable battery when the battery voltage reached a prescribed constant voltage in the constant current-constant voltage charging.

FIG. 15 shows a curve of changes in the battery voltage (this corresponds to the open-circuit voltage because the charging current value at this time is substantially zero) of the cycle-deteriorated inspective rechargeable battery (b) to elapsed time for 120 minutes after the termination of the charging for the inspective rechargeable battery (b), when the inspective rechargeable battery was charged by the constant current charging mode at 1.7 A and the charging was terminated when the charging voltage reached 4.2 V. As the curve shown in FIG. 15 illustrates, it is understood that the battery voltage is gradually decreased and after an elapsed time for 90 minutes, the battery voltage is converged to a voltage value of 3.85.

Figure 16:
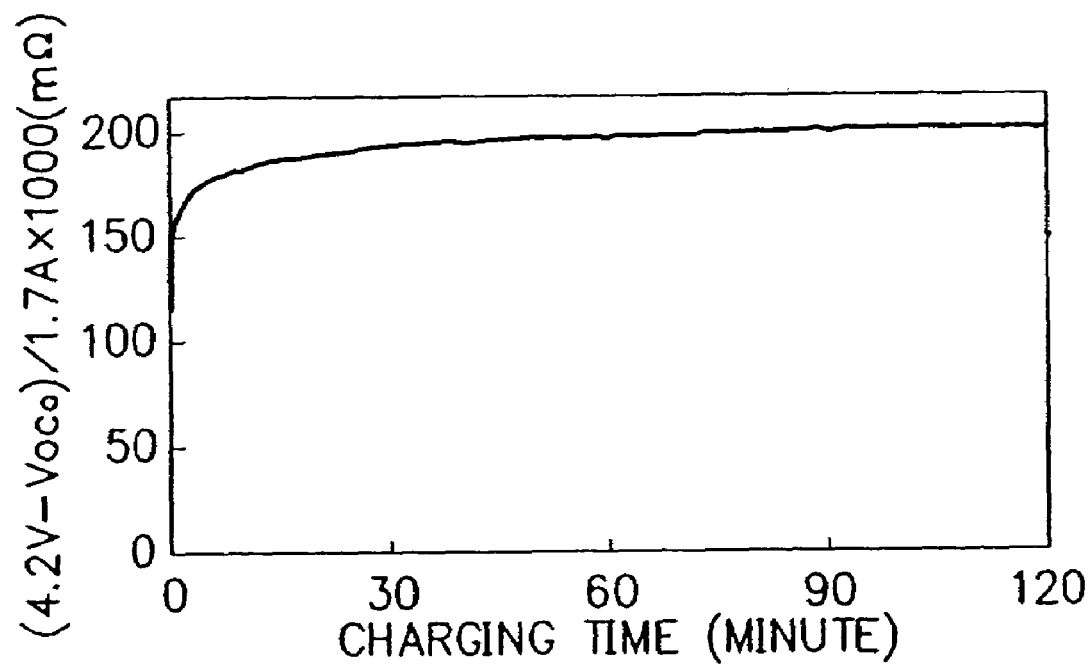
FIG. 16 shows a graph exemplifying a curve obtained by making the battery voltage [=open-circuit voltage (Voc)] of the axis of ordinates in FIG. 15 to be $Voc_0$ and performing computation of the equation (1) which will be described later.

FIG. 16 shows a curve formed by a manner wherein the battery voltage values of the axis of ordinates in FIG. 15 are inputted in the $Voc_0$ of the foregoing equation (1) and the resultant internal resistance values are plotted under condition of making Vd=4.2 and I=1.7.

The curve shown in FIG. 16 illustrates values obtained when the internal resistance of the inspective rechargeable battery (b) was computed by regarding the battery voltages at the respective times to be open-circuit voltages.

When it is presumed that the above voltage value of 3.85 V is an open-circuit voltage value after 90 minutes have elapsed, it is considered such that the 3.85 V corresponds to a reasonable open-circuit voltage value and 205.9 (mΩ) is a true internal resistance (R).

Figure 17:
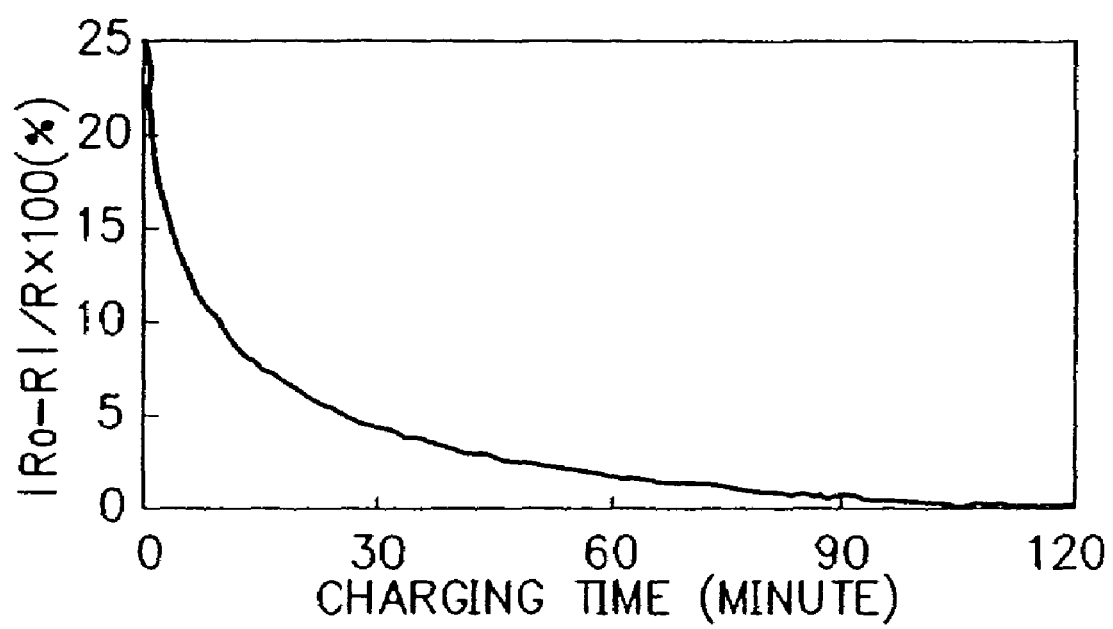
FIG. 17 shows a graph exemplifying a curve obtained by making the resistance value of the axis of ordinates in FIG. 16 to be $R_0$ and performing computation of the equation (11) which will be described later.

FIG. 17 shows a curve formed by a method wherein the computation of the following equation (11) by making the internal resistance values of the axis of ordinates in FIG. 16, which are computed from the battery voltages against elapsed time, to be of $R_0$ and plotting the computed results in the axis of ordinates in relation of the elapsed time of the axis of abscissa.

$$|R_0 - R|/R \times 100 \quad (11)$$

The curve shown in FIG. 17 illustrates erroneous difference deviations from the true internal resistance (R) when the internal resistance of the inspective rechargeable battery (b) was computed by regarding the battery voltages at the respective times to be open-circuit voltages.

With reference to the curve shown in FIG. 17, it is understood that the above-described erroneous difference 1.1% [obtained from the foregoing equation (9)] of the precision which is quite similar to that when the pausing time for more than 80 minutes is taken. This indicates that when the detecting method of the present invention is adopted, the period of time for 80 minutes for measuring the open-circuit voltage in order to compute the internal resistance is unnecessary.

Thus, it is understood that according to the detecting method of the present invention, it is possible to readily detect internal resistance of an inspective rechargeable battery at a high precision from a measured value of a charged electricity quantity of the inspective rechargeable battery in the constant voltage charging mode even when said inspective rechargeable battery has been cycle-deteriorated, without necessity of performing a particular operation during the constant current-constant voltage charging regime or consuming a particular period of time for the detection.

EXAMPLE 3

As well as in the case of Example 1, there were provided (a) a normal rechargeable battery comprising commercially available normal lithium ion rechargeable battery having a nominal capacity of 1680 mAh, a diameter of 18 mm and a height of 65 mm and (b) an inspective rechargeable battery comprising a rechargeable battery which is of the same kind and type as the normal rechargeable battery (a).

For the normal rechargeable battery (a), data of the relationship of the charged electricity quantity (charge capacity) thereof to the internal resistance thereof when increased or decreased or an increased or decreased magnitude of said internal resistance in the constant voltage charging mode of the constant current-constant voltage charging regime had been previously acquired in accordance with the previously described method with reference to FIG. 9. Said data includes data obtained from the foregoing function formula (4) relating to the relationship R(Q) of said internal resistance (R) (including an increased or decreased magnitude of said internal resistance) to said charged electricity quantity (Q).

For the inspective rechargeable battery (b), it was deteriorated by maintaining it in an atmosphere with a temperature of 80° C. for 10 days.

Following the flow chart shown in FIG. 2, the deteriorated inspective rechargeable battery (b) was charged by the constant current-constant voltage regime and internal resistance thereof was detected (predicted). After this, an actual internal resistance of the inspective rechargeable battery (b) was measured.

The effectiveness of the detecting method of the present invention was examined by comparing the detected internal resistance with the actual internal resistance.

Particularly, the inspective rechargeable battery (b) was charged by the constant current charging mode at a constant current value 1.7 A until the time when the charging voltage reached 4.2 V, following this, the inspective rechargeable battery (b) was charged by the constant voltage charging mode at a constant voltage value of 4.2 V, where the charging was terminated when the charging current was decreased to 0.1 A, and a charged electricity quantity ($Q_{cv}'$) of the inspective rechargeable battery (b) in the constant voltage charging mode was measured. Then, after the charged electricity quantity ($Q_{cv}'$) of the inspective rechargeable battery (b) was multiplied by 1/D time [D is a reduction rate in the electricity storable capacity of the inspective rechargeable battery (b)], the value obtained by multiplying the charged electricity quantity by 1/D was substituted in the Q of the foregoing function formula (4) [which is of the relationship R(Q) between the internal resistance R (including an increased or decreased magnitude of said internal resistance) to the charged electricity quantity Q in the constant current charging mode].

Here, D value was obtained as well as in the case of Example 2, by performing computation of the equation (5) using measured data of the inspective rechargeable battery (b) which are used in the equation (5) and the previously acquired data of the normal rechargeable battery (a) which are used in the equation (5).

By this, internal resistance (R) of the inspective rechargeable battery (b) was detected (predicted).

After this, the inspective rechargeable battery (b) was discharged at a constant current value of 0.17 A until a final voltage of 3.0 V, and thereafter, the inspective rechargeable battery (b) was charged by the constant current charging mode at 1.7 A and the charging by this constant current charging mode was terminated when the charging voltage reached 4.2 V, then after a prescribed period of time elapsed, the open-circuit voltage (V) of the inspective rechargeable battery (b) was measured, and in accordance with the foregoing equation (1), internal resistance (R) of the inspective rechargeable battery (b) was computed.

The results obtained in the above are collectively shown in Table 6. In Table 6, the value of the charged electricity quantity $Q_{cv}'$ by CV is a charged electricity quantity in the constant voltage charging mode, the value of the detected internal resistance (mΩ) is a predicted internal resistance value obtained by the detecting method of the present invention, the value of the open-circuit voltage (V) is an open-circuit voltage value at the time when the prescribed period of time elapsed after the termination of the charging, and the valued of the computed internal resistance (mΩ) is an internal resistance value computed from the open-circuit voltage value Voc computed in the equation (1) as being Vc=4.7 and I=1.7A.

From the results shown in Table 6, an erroneous difference between the detected internal resistance value [305.8 (mΩ)] and the computed internal resistance value [311.8 (mΩ)] of the inspective rechargeable battery (b) was computed as shown in the following equation.

$$|305.8-311.8|/311.8 \times 100 = 1.9(\%) \quad (12)$$

Thus, said erroneous difference was found to be 1.9%.

Here, the reduction rate D in the electricity storable capacity of the inspective rechargeable battery (b) in Table 6 is a value obtained in the following manner.

In the above charging operation for the inspective rechargeable battery (b), a duration ($t_M'$) from the time when the constant current charging mode at 1.7 A was shifted to the constant voltage charging mode at 4.2 V until the time when the charging current value in the constant voltage charging mode became to be a prescribed value of 0.85 A and a charged electricity quantity ($Q_{cv}'$) in the constant voltage charging mode at that time were measured.

Here, the duration ($t_M$) and the charged electricity quantity ($Q_{cv}$) of the normal rechargeable battery (a) are known from the previously acquired data thereof which are used in the equation (5). Thus, by substituting said $Q_{cv}'$ and $t_M'$ for the inspective rechargeable battery (b) and said $Q_{cv}$ and $t_M$ for the normal rechargeable battery (b) in the foregoing equation (5), there was obtained a D value.

The results obtained are collectively shown in Table 7.

Here, because the I in the equation (1) is a charging current value of 1.7 A in the constant current charging mode, the D value as the reduction rate in the electricity storable capacity of the inspective rechargeable battery (b) can be computed in accordance with the following equation (13).

$$D=(1.1705 \times 1.7-0.637)/(0.4038-1.7 \times 0.170) \quad (13)$$

From FIG. 17, the above-described erroneous difference 1.9% was found to be of the precision which is quite similar to the internal resistance value obtained from the open-circuit voltage value after the elapsed time for 45 minutes.

Thus, it is understood that according to the detecting method of the present invention, it is possible to readily detect internal resistance of an inspective rechargeable battery at a high precision from a measured value of a charged electricity quantity of the inspective rechargeable battery in the constant voltage charging mode even when said inspective rechargeable battery has been deteriorated because of the storage in a high temperature atmosphere over a long period of time, without necessity of performing a particular operation during the constant current-constant voltage charging regime or consuming a particular period of time for the detection.

EXAMPLE 4

There was provided (a) a normal rechargeable battery comprising commercially available normal lithium ion rechargeable battery having a nominal capacity of 1680 mAh, a diameter of 18 mm and a height of 65 mm. For this normal rechargeable battery (a), data of the relationship of the charged electricity quantity (charge capacity) thereof to the internal resistance thereof when increased or decreased or an increased or decreased magnitude of said internal resistance in the constant voltage charging mode of the constant current-constant voltage charging regime had been previously acquired in accordance with the previously described method with reference to FIG. 9. For the normal rechargeable battery (a), data of the relationship of the discharge capacity correction coefficient at a prescribed battery temperature T and a prescribed discharging current value $I_d$ to said internal resistance also had been acquired in accordance with the method described in the foregoing acquisition example of data of correction coefficient for the discharged electricity quantity.

As the inspective rechargeable battery (b), there was provided a rechargeable battery pack (whose electricity storable capacity is considered to be free from reduction) having a rechargeable battery which is of the same kind and type as the normal rechargeable battery and in which an overcharge prevention element comprising a MOS provided with a parasitic diode, an overdischarge prevention element comprising an EFT (the trade name: FY8ABJ-03, produced by Mitsubishidenki Kabushiki Kaisha) and a resistor WSL-2512 (20 mΩ) (produced by Vishay Intertechnology Inc.) for detecting a discharging current are accommodated in the charging and discharging path of said rechargeable battery.

This rechargeable battery pack will be hereinafter referred as "inspective rechargeable battery (b)".

Following the flow chart shown in FIG. 1, the inspective rechargeable battery (b) was charged by the constant current-constant voltage regime and internal resistance of the inspective rechargeable battery (b) was detected (predicted). After this, an actual internal resistance of the inspective rechargeable battery (b) was measured.

The effectiveness of the detecting method of the present invention was examined by comparing the detected internal resistance with the actual internal resistance.

Particularly, the inspective rechargeable battery (b) was charged by the constant current charging mode at a constant current value of 1.7 A until the time when the charging voltage reached 4.2 V, following this, the inspective rechargeable battery (b) was charged by the constant voltage charging mode at a constant voltage value of 4.2 V, where the charging was terminated when the charging current was decreased to 0.1 A, and a charged electricity quantity of the inspective rechargeable battery (b) in the constant voltage charging mode was measured.

Then, the charged electricity quantity of the inspective rechargeable battery (b) was substituted in the Q of the foregoing function formula (4) of the relationship R(Q) of the internal resistance R to the charged electricity quantity Q, obtained from aforesaid data of the normal rechargeable battery (a) with respect to the relationship of the charged electricity quantity thereof to the internal resistance thereof when increased or decreased or an increased or decreased magnitude of said internal resistance, whereby internal resistance the inspective rechargeable battery (b) was detected (predicted).

The detected internal resistance was substituted in the foregoing function formula (7) which is an example of the discharge capacity correction coefficient for the relationship of a ratio of the discharged electricity quantity (=the discharge capacity) until the time when the battery voltage reaches 3.0 V at a battery temperature 25° C. and a discharging current value of 1.7 A versus the nominal capacity, whereby a ratio of a discharge capacity until the time when the battery voltage reached at a battery temperature of 25° C. and a discharging current of 1.7 A versus the nominal capacity was estimated, and from the estimated value, the time during which the discharging is capable being performed was anticipated.

After this, the inspective rechargeable battery (b) was discharged at a battery temperature of 25° C. and a discharging current value of 1.7 A until a final voltage of 3.0 V, where a discharging time from the commencement of the discharging until the time when the battery voltage reached 3.0 V as the final voltage was measured. Thereafter, the inspective rechargeable battery (b) was charged by the constant current charging mode at a constant current value of 1.7 A and the charging by this constant current charging mode was terminated when the charging voltage reached 4.2 V, then after a prescribed period of time elapsed, the open-circuit voltage (=the battery voltage) of the inspective rechargeable battery (b) was measured, and in accordance with the foregoing equation (1), internal resistance of the inspective rechargeable battery (b) was computed.

The results relating to the internal resistance which were obtained in the above are collectively shown in Table 8, and the results relating to the charging time which were obtained in the above are collectively shown in Table 9.

From the results shown in Table 8, an erroneous difference between the detected internal resistance value [233.1 (mΩ)] and the internal resistance value [235.3 (mΩ)] (computed from the open-circuit voltage value) of the inspective rechargeable battery (b) was computed as shown in the following equation (14).

$$|233.1-235.3|/235.3\times100=0.9(\%) \quad (14)$$

Thus, said erroneous difference between the detected internal resistance value and the computed internal resistance value was found to be 0.9%.

Separately, from the results shown in FIG. 9, an erroneous difference between the estimated value [56.7 (minutes)] and the measured value [57.1 (minutes)] with respect to the discharging time until the time when the battery voltage of the inspective rechargeable battery (b) reached 3.0 V at the battery temperature of 25° C. and the discharging current of 1.7 A was computed as shown in the following equation (15).

$$|56.7-57.1|/57.1\times100=0.7(\%) \quad (14)$$

Said erroneous difference between the estimated value and the measured value with respect to the charging time was found to be 0.7%.

As will be understood from the above description, even when the inspective rechargeable battery is a rechargeable battery in a rechargeable battery pack having a control circuit in which one or more of a switching element for charging which is capable of performing ON-OFF control, a switching element for discharging, and a detecting element for detecting a charge-and-discharge current value are accommodated in a charging-and-discharging path of said rechargeable battery, it is possible to readily detect internal resistance of said rechargeable battery pack at a high precision from a measured value of a charged electricity quantity thereof in the constant voltage charging mode, without necessity of performing a particular operation during the constant current-constant voltage charging regime or consuming a particular period of time for the detection.

From the evaluated results in Examples 1 to 4, it is understood that according to the detecting method of the present invention, internal resistance of a given inspective rechargeable battery can be readily detected at a high precision by an extremely simple manner, without necessity of performing a particular operation during the constant current-constant voltage charging regime or consuming a particular period of time for the detection.

Incidentally, Examples 1 to 4, the commercially available lithium ion rechargeable battery of one kind have used, but this is not limitative. Any other rechargeable battery of various sizes, various kinds, or various types can be used for the detection of their internal resistance by the detecting method of the present invention as long as they are capable of being charged by the constant current-constant voltage charging regime. Further, in Examples 1 to 4, examples for detecting internal resistance of the single cells have described. But this is not limitative. Also for various rechargeable battery packs in which a plurality of cells are connected in series connection, in parallel connection or in series and parallel connections, according to the detecting method of the present invention, their internal resistance can be detected at a high precision on the basis of previously acquired data of corresponding normal rechargeable battery packs capable of being reference standards for them.

Separately, in the above description, the present invention has been detailed by illustrating various embodiments and various examples. It should be understood that the scope of the present invention is not restricted by these embodiment and these examples. That is, these embodiment and these examples can be variously modified within a range which does not hinder the principle of the present invention.

TABLE 1

| connection resistor (mΩ) | accumulated charged electricity quantity (mAh) | charged electricity quantity by CV (mAh) | open-circuit voltage (V) | computed internal resistance (mΩ) |
|---|---|---|---|---|
| 0 | 1678.1 | 403.8 | 3.96 | 141.2 |
| 27 | 1669.8 | 544.3 | 3.91 | 170.6 |
| 39 | 1669.0 | 601.3 | 3.89 | 182.4 |
| 62 | 1663.9 | 729.3 | 3.85 | 205.9 |
| 91 | 1658.4 | 924.9 | 3.80 | 235.3 |
| 110 | 1654.2 | 1106.9 | 3.77 | 252.9 |
| 150 | 1650.8 | 1394.4 | 3.71 | 288.2 |

CV: constant-voltage charging

TABLE 2

| connection resistor (mΩ) | computed internal resistance (mΩ) | charged electricity quantity at 1.7 A (mAh) | ratio to nominal capacity when it is set at 1.0 |
|---|---|---|---|
| 0 | 141.2 | 1646.4 | 0.980 |
| 27 | 170.6 | 1632.1 | 0.972 |
| 39 | 182.4 | 1627.6 | 0.969 |
| 62 | 205.9 | 1617.9 | 0.963 |
| 91 | 235.3 | 1608.1 | 0.957 |
| 110 | 252.9 | 1597.7 | 0.951 |
| 150 | 288.2 | 1580.4 | 0.941 |

TABLE 2-continued

| connection resistor (mΩ) | computed internal resistance (mΩ) | charged electricity quantity at 1.7 A (mAh) | ratio to nominal capacity when it is set at 1.0 |
|---|---|---|---|

TABLE 3

| charged electricity quantity by CV (mAh) | 424.6 |
|---|---|
| detected internal resistance (mΩ) | 145.4 |
| open-circuit voltage (V) | 3.955 |
| computed internal resistance (mΩ) | 144.1 |

TABLE 4

| charged electricity quantity ($Q_{cv}'$) by CV(mΩ) | 623.1 |
|---|---|
| reduction rate in electricity storable capacity (D) | 0.867 |
| $Q_{cv}' \times 1/D$ (mAh) | 718.9 |
| detected internal resistance (mΩ) | 203.6 |
| open-circuit voltage (V) | 3.850 |
| computed internal resistance (mΩ) | 205.9 |

NOTE:
$Q_{cv}'$ is of inspective rechargeable battery

TABLE 5

| | normal rechargeable battery | inspective rechargeable battery |
|---|---|---|
| charged electricity quantity ($Q_{cv}$) by CV (Ah) | 0.4038 | — |
| charged electricity quantity ($Q_{cv}'$) by CV (Ah) | — | 0.6231 |
| time until reached 0.85 A $t_M$ (hour) | 0.170 | — |
| time until reached 0.85 A $t_M'$ (hour) | — | 0.308 |

NOTE:
$Q_{cv}$ is of normal rechargeable battery

TABLE 6

| charged electricity quantity ($Q_{cv}'$) by CV(mAh) | 1170.5 |
|---|---|
| reduction rate in electricity storable capacity (D) | 0.763 |
| $Q_{cv}' \times 1/D$ (mAh) | 1534.0 |
| detected internal resistance (mΩ) | 305.8 |
| open-circuit voltage (V) | 3.670 |
| computed internal resistance (mΩ) | 311.8 |

TABLE 7

| | normal rechargeable battery | inspective rechargeable battery |
|---|---|---|
| charged electricity quantity ($Q_{cv}$) by CV (Ah) | 0.4038 | — |
| charged electricity quantity ($Q_{cv}'$) by CV (Ah) | — | 1.1705 |
| time until reached 0.85 A $t_M$ (hour) | 0.170 | — |
| time until reached 0.85 A $t_M'$ (hour) | — | 0.637 |

TABLE 8

| charged electricity quantity by CV (mAh) | 924.9 |
|---|---|
| detected internal resistance (mΩ) | 233.1 |
| open-circuit voltage (V) | 3.800 |
| computed internal resistance (mΩ) | 235.3 |

TABLE 9

| detected internal resistance (mΩ) | 233.1 |
|---|---|
| correction coefficient for estimated electricity quantity to be discharged | 0.957 |
| estimated electricity quantity capable of being discharged at 1.7 A (mAh) | 1607.0 |
| estimated duration for the discharging to be able to perform at 1.7 A (minute) | 56.7 |
| measured duration for the discharging having been performed at 1.7 A (minute) | 57.1 |

What is claimed is:

1. A computer-executable program for detecting internal resistance of an inspective rechargeable battery, said program being stored on a computer-readable medium and having incorporated therein a detecting method for detecting internal resistance of an inspective rechargeable battery when said inspective rechargeable battery is charged by a constant current-constant voltage charging regime comprising a constant current charging mode and a constant voltage charging mode in that charging is commenced by said constant current charging mode at a constant current value $I_0$ and after the battery voltage of said inspective rechargeable battery reaches a given voltage value $V_{max}$, the charging is performed by said constant voltage charging mode at a constant voltage $V_{max}$ until the termination thereof, said detecting method comprising the steps of:

(a) obtaining an accumulated, charged electricity quantity of said inspective rechargeable battery in said constant voltage charging mode; and (b) comparing said charged electricity quantity obtained in said step (a) to previously acquired data of a normal rechargeable battery in said constant voltage charging mode, said normal rechargeable battery corresponding to said inspective rechargeable battery, wherein said previously acquired data are with respect to relationships between charged electricity quantities $Q_{cv}$ of said normal rechargeable battery and increased or decreased internal resistances of said normal rechargeable battery or between said charged electricity quantities $Q_{cv}$ and increased or decreased magnitudes of said internal resistances, wherein when said inspective rechargeable battery has an electricity storable capacity which is reduced to a magnitude of D time that of said normal rechargeable battery, where D is a constant of $0<D\leq1$, said detecting method further includes a step of correcting said charged electricity quantity obtained in said step (a) by multiplying said charged electricity quantity by 1/D time, wherein the corrected electrical quantity is compared to said previously acquired data of said normal rechargeable battery described in said step (b), and wherein in a case where it is presumed that said electricity storable capacity of said inspective rechargeable battery is reduced to a magnitude of D time that of said normal rechargeable battery, when a duration from a shift time when said constant current charging mode at said constant current value $I_0$ is shifted to said constant voltage charging mode at said constant voltage $V_{max}$ until a time when the charging current value in said constant voltage charging mode reaches a prescribed current value $I_M$ and an electricity quantity charged in said constant voltage charging mode are made to be respectively $t_M'$ and $Q_{cv}'$ for said inspective rechargeable battery and $t_M$ and $Q_{cv}$ for said normal rechargeable battery, in accordance with a function formula $D=(Q_{cv}'-I_0 \times t_M')/(Q_{cv}-I_0 \times t_M)$, said electricity storable capacity of said inspective rechargeable battery is estimated to be D time that of said normal rechargeable battery.

2. The computer-executable program according to claim 1, wherein said prescribed current value $I_M$ is in a range of $0.4 \times I_0 \leq I_M \leq 0.6 \times I_0$ with respect to said charging current value $I_0$ in said constant current charging mode.

3. The computer-executable program according to claim 1, wherein said previously acquired data of said normal rechargeable battery include previously measured data of said relationships of said normal rechargeable battery, function formulas obtained from said measured data, and function formulas based on said measured data which are obtained by way of simulation by a computer, wherein said previously acquired data of said normal rechargeable battery include data of relationships between said charged electricity quantities $Q_{cv}$ of said normal rechargeable battery and resistance values $r_s$ based on resistors or include data of relationships between said charged electricity quantities $Q_{cv}$ and internal resistance values $(R_1+r_s)$ of said normal rechargeable battery, wherein said data of relationships between said charged electricity quantities $Q_{cv}$ and said internal resistance values $(R_1+r_s)$ are obtained by a method wherein each of a plurality of resistors each having a different resistance value $(r_s)$ is separately connected to said normal rechargeable battery in series connection to artificially increase an internal resistance value $(R_1)$ of said normal rechargeable battery to a resistance value $(R_1+r_s)$ as an artificially internal resistance value, wherein in each case where one of said plurality of resistors is connected to said normal rechargeable battery, said normal rechargeable battery is charged by said constant current-constant voltage charging regime comprising said constant current charging mode and said constant voltage charging mode in that charging is commenced by said constant current charging mode at said constant current value $I_0$ and after the battery voltage of said normal rechargeable battery reaches said given voltage value $V_{max}$, the charging is performed by said constant voltage charging mode at said constant voltage $V_{max}$ until the termination thereof, and wherein in each case where one of said plurality of resistors is connected to said normal rechargeable battery, a charged electricity quantity $Q_{cv}$ of said normal rechargeable battery is measured and a relationship between said charged electricity quantity $Q_{cv}$ and said artificially internal resistance value of said normal rechargeable battery is obtained.

4. The computer-executable program according to claim 3, wherein in each case where one of said plurality of resistors is connected to said normal rechargeable battery, an open-circuit voltage Voc of said normal rechargeable battery when the battery voltage reaches said voltage value $V_{max}$ is measured and a charged electricity quantity $Q_{cv}$ of said normal rechargeable battery in said constant voltage charging mode at that time is measured, and from said constant current value $I_0$ in said constant current charging mode, said measured open-circuit voltage Voc and said measured charged electricity quantity $Q_{cv}$ and from a function formula $R=(V_{max}-Voc)/I_0$, an internal resistance value of said normal rechargeable battery whose internal resistance value is artificially increased to $(R_1+r_s)$ is computed, and a relationship between said measured charged electricity quantity $Q_{cv}$ and said computed internal resistance value of said normal rechargeable battery is obtained.

5. The computer-executable program according to claim 1, wherein a time point when said charged electricity quantity of said inspective rechargeable battery in said constant voltage charging mode is measured is any of the following three time points:
(1) a time point when the charging current in said constant voltage charging mode is sufficiently decreased to a prescribed current value ($I_{min}$);
(2) a time point when a prescribed time ($t_n$) elapses since the time when the charging current value in said constant voltage charging mode reaches a prescribed current value ($I_n$); and
(3) a time point when a prescribed time ($t_f$) elapses since the time when said constant current charging mode is shifted to said constant voltage charging mode.

6. The computer-executable program according to claim 1, wherein after said internal resistance of said inspective rechargeable battery is predicted to be R on the basis of said previously acquired data, it is presumed that a total discharged electricity quantity $C_d$ of said normal rechargeable battery whose internal resistance is $R_1$ is expressed by $C_d=C_N \times f\_T, i(R_1)$ from an electricity storable capacity $C_N$ of said normal rechargeable battery and a correction coefficient $f\_T, i(R_1)$ for a discharged electricity quantity of said normal rechargeable battery which is determined by said internal resistance $R_1$ at a battery temperature T and a discharging current I, and wherein in a case where electricity storable capacity is not reduced in said inspective rechargeable battery, a total discharged electricity quantity $C_d'$ of said inspective rechargeable battery is expressed by $C_d'=C_N \times f\_T, i(R_1)$ from said electricity storable capacity $C_N$ of said normal rechargeable battery and a correction coefficient $f\_T, i(R)$ for a discharged quantity of said normal rechargeable battery having said internal resistance value R at a battery temperature T and a discharging current I, with said internal resistance value R being computed by artificially increasing $R_1$ by a magnitude of $r_s$, and wherein when for an instrument in which said inspective rechargeable battery is used as a power source, an average consumption electric current of the instrument is made to be i, an average consumption power of the instrument is made to be p, an average discharging voltage of said normal rechargeable battery when it is discharged at a discharging current value i is made to be $V_m$, and an average discharging voltage of said inspective rechargeable battery when it is discharged at said discharging current value i is made to be $V_m'$, a time h during which said instrument is capable of being operated is computed in accordance with an equation $$h=C_d'/i \text{ or } h=(V_m' \times C_d')/p, \text{ where } V_m'=V_m-i \times (R-R_1)$$
$$=V_m-i \times r_s.$$

7. The computer-executable program according to claim 6, wherein said correction coefficient $f\_T, i(R_1)$ for said discharged electricity quantity of said normal rechargeable battery is selected from (i) previously acquired data relating to correction coefficients for discharged electricity quantities and (ii) function formulas obtained by simulation by a computer based on said previously acquired data relating to correction coefficients, wherein said previously acquired data of said normal rechargeable battery include data of relationships between internal resistance values $(R_1+r_s)$ and discharged electricity quantities $C_d$ of said normal rechargeable battery, wherein said internal resistance values $(R_1+r_s)$ and said discharged electrical quantities $C_d$ are obtained by a method wherein each of a plurality of resistors each having a different resistance value ($r_s$) is separately connected to said normal rechargeable battery in series connection to artificially increase said internal resistance value ($R_1$) of said normal rechargeable battery to a resistance value ($R_1+r_s$) as an artificially increased resistance value, and wherein in each case where one of said plurality of resistors is connected to said normal rechargeable battery, said normal rechargeable battery is charged by said constant current-constant voltage charging regime comprising said constant current charging mode and said constant voltage charging mode in that charging is commenced by said constant current charging mode at said constant current value $I_0$ and after the battery voltage of said normal rechargeable battery reaches said given voltage value $V_{max}$, the charging is performed by said constant voltage charging mode at said constant voltage $V_{max}$ until the termination thereof and after the charging is terminated, said normal rechargeable battery is discharged at a prescribed battery temperature T and a prescribed discharging current value I until the battery voltage of said normal rechargeable battery reaches a prescribed voltage value $V_{min}$, where a discharged electricity quantity $C_d$ is measured, and a relationship between said measured discharged electricity quantity $C_d$ and said artificially increased internal resistance value of said normal rechargeable battery is obtained.

8. The computer-executable program according to claim 6, wherein said correction coefficient $f\_{T, i}(R_1)$ for said discharged electricity quantity of said normal rechargeable battery is selected from (i) previously acquired data relating to correction coefficients for discharged electricity quantities and (ii) function formulas obtained by simulation by a computer based on said previously acquired data relating to correction coefficients, wherein said previously acquired data of said normal rechargeable battery include data of relationships between internal resistance values ($R_1+r_s$) and discharged electricity quantities $C_d$ of said normal rechargeable battery, wherein said internal resistance values ($R_1+r_s$) and said discharged electricity quantities $C_d$ are obtained by a method wherein each of a plurality of resistors each having a different resistance value ($r_s$) is separately connected to said normal rechargeable battery in series connection to artificially increase an internal resistance value ($R_1$) of said normal rechargeable battery to a resistance value ($R_1+r_s$) as a pseudo-internal resistance value, and wherein in each case where one of said plurality of resistors is connected to said normal rechargeable battery, said normal rechargeable battery is charged by said constant current-constant voltage charging regime comprising said constant current charging mode and said constant voltage charging mode in that charging is commenced by said constant current charging mode at said constant current value $I_0$ and after the battery voltage of said normal rechargeable battery reaches said given voltage value $V_{max}$, the charging is performed by said constant voltage charging mode at said constant voltage $V_{max}$ until the termination thereof and after the charging is terminated, said normal rechargeable battery is discharged at a prescribed battery temperature T and a prescribed discharging current value I until the battery voltage of said normal rechargeable battery reaches a prescribed voltage value $V_{min}$, where a discharged electricity quantity $C_d$ of said normal rechargeable battery is measured, and an open-circuit voltage Voc of said normal rechargeable battery when the battery voltage reaches said voltage value $V_{max}$, in said constant current-constant voltage charging operation is measured, and from said constant current value $I_0$ in the constant current charging mode and said measured open-circuit voltage Voc and in accordance with a function formula $R=(V_{max}-Voc)/I_0$, an internal resistance value of said normal rechargeable battery whose internal resistance value is artificially increased to R, with R equaling $R_1+r_s$, is computed, and a relationship between said measured discharged electricity quantity $C_d$ and said computed internal resistance value R of said normal rechargeable battery is obtained.

9. The computer-executable program according to claim 6, wherein in a case where said inspective rechargeable battery has an electricity storable capacity which is reduced to a magnitude of D time that of said normal rechargeable battery, where D is a constant of $0<D\leqq1$, it is presumed that said total discharged electricity quantity $C_d'$ of said inspective rechargeable battery is expressed by $C_d'=D\times C_N\times f\_{T, i}(R)$ from said electricity storable capacity $C_N$ of said normal rechargeable battery and said correction coefficient $f\_{T, i}(R)$.

* * * * *

UNITED STATES PATENT AND TRADEMARK OFFICE
CERTIFICATE OF CORRECTION

| | |
|---|---|
| PATENT NO. | : 7,388,383 B2 |
| APPLICATION NO. | : 11/656995 |
| DATED | : June 17, 2008 |
| INVENTOR(S) | : Kawakami et al. |

It is certified that error appears in the above-identified patent and that said Letters Patent is hereby corrected as shown below:

ON THE TITLE PAGE:
      Item (54) Line 2, "DETECTING INTERNAL" should read -- DETECTING INTERNAL RESISTANCE --.

COLUMN 1:
      Line 2, "INTERNAL" should read -- INTERNAL RESISTANCE --;
      Line 43, "battery" should read -- batteries --;
      Line 46, "been" should be deleted;
      Line 61, "stored in" should read -- stored in a --; and
      Line 66, "battery" should read -- batteries --.

COLUMN 2:
      Line 45, "respect" should read -- respect to --; and
      Line 66, "ordinary" should read -- an ordinary --.

COLUMN 3:
      Line 21, "ordinary" should read -- an ordinary --;
      Line 37, "as" should read -- as a --; and
      Line 46, "acquisition" should read -- acquisition of --.

COLUMN 5:
      Line 20, "an" should be deleted;
      Line 26, "provided" should read -- provides --;
      Line 32, "battery" should read -- batteries --;
      Line 34, "battery" should read -- batteries --;
      Line 35, "battery" should read -- batteries --;
      Line 37, "battery" should read -- batteries --; and
      Line 40, "battery" should read -- batteries --.

UNITED STATES PATENT AND TRADEMARK OFFICE
CERTIFICATE OF CORRECTION

PATENT NO. : 7,388,383 B2
APPLICATION NO. : 11/656995
DATED : June 17, 2008
INVENTOR(S) : Kawakami et al.

It is certified that error appears in the above-identified patent and that said Letters Patent is hereby corrected as shown below:

COLUMN 6:
        Line 65, "data" should read -- data of --; and
        Line 66, "to relationship" should read -- to relationships --.

COLUMN 7:
        Line 56, "a" should read -- an --.

COLUMN 9:
        Line 41, "which" should be deleted; and
        Line 42, "a electricity" should read -- an electricity --.

COLUMN 10:
        Line 4, "substantially is" should read -- substantially --;
        Line 10, "rechargeable" should read -- rechargeable battery --;
        Line 10, "corresponds" should read -- corresponds to --;
        Line 20, "greater that" should read -- greater than that --;
        Line 21, "corresponds said" should read -- corresponds to said --;
        Line 22, "is" should be deleted;
        Line 24, "to be" should be deleted;
        Line 28, "at early" should read -- at an early --;
        Line 52, "necessitated." should read -- necessary. --;
        Line 65, "[AQUISITION EXPERIMENTS OF DATA OF NOR-" should read -- [Acquisition Experiments of Data of Nor- --;
        Line 66, "MAL RECHARGEABLE BATTERY, WITH RESPECT TO" should read -- mal Rechargeable Battery, with Respect to --; and
        Line 67, "RELATIONSHIP BETWEEN CHARGED ELECTRICITY" should read -- Relationship between Charged Electricity --.

UNITED STATES PATENT AND TRADEMARK OFFICE
CERTIFICATE OF CORRECTION

PATENT NO.       : 7,388,383 B2  
APPLICATION NO.  : 11/656995  
DATED            : June 17, 2008  
INVENTOR(S)      : Kawakami et al.

It is certified that error appears in the above-identified patent and that said Letters Patent is hereby corrected as shown below:

COLUMN 11:
  Line 1, "QUANTITY N THE CONSTANT VOLTAGE CHARGING" should read -- Quantity in the Constant Voltage Charging --;
  Line 2, "MODE AND INTERNAL RESISTANCE]" should read -- Mode and Internal Resistance --;
  Line 33, "a increased" should read -- an increased --; and
  Line 55, "62 m Ω" should read -- 62 mΩ --.

COLUMN 12:
  Line 32, "to be" should be deleted;
  Line 38, "to be" should be deleted; and
  Line 39, "to be" should be deleted.

COLUMN 13:
  Line 39, "connected" should read -- connecting --; and
  Line 51, "prior" should read -- prior to --.

COLUMN 14:
  Line 34, "battery" should read -- batteries --.

COLUMN 15:
  Line 35, "corresponds" should read -- corresponds to --;
  Line 42, "rare" should read -- rate --; and
  Line 53, "to be" should be deleted.

COLUMN 18:
  Line 3, "to be" should be deleted; and
  Line 13, "to be" should be deleted.

UNITED STATES PATENT AND TRADEMARK OFFICE
CERTIFICATE OF CORRECTION

| | |
|---|---|
| PATENT NO. | : 7,388,383 B2 |
| APPLICATION NO. | : 11/656995 |
| DATED | : June 17, 2008 |
| INVENTOR(S) | : Kawakami et al. |

It is certified that error appears in the above-identified patent and that said Letters Patent is hereby corrected as shown below:

COLUMN 19:
        Line 18, "can" should read -- can be --;
        Line 60, "to be" should be deleted; and
        Line 63, "to be" should be deleted.

COLUMN 20:
        Line 46, "is" should be deleted.

COLUMN 21:
        Line 7, "computer" should read -- compute --;
        Line 8, "battery-by" should read -- battery by --;
        Line 60, "the" should be deleted;
        Line 61, "purpose and not" should read -- simplification purposes and is not --; and
        Line 62, "battery" should read -- batteries --.

COLUMN 22:
        Line 48, "battery" should read -- batteries --;
        Line 50, "battery" should read -- batteries --;
        Line 52, "battery" should read -- batteries --;
        Line 55, "battery" should read -- batteries --; and
        Line 57, "battery" should read -- batteries --.

COLUMN 23:
        Line 31, "there of" should read -- thereof --; and
        Line 35, "an rechargeable" should read -- a rechargeable battery --.

COLUMN 24:
        Line 39, "[Aquisition" should read -- [Acquisition --.

UNITED STATES PATENT AND TRADEMARK OFFICE
CERTIFICATE OF CORRECTION

PATENT NO.        : 7,388,383 B2
APPLICATION NO.   : 11/656995
DATED             : June 17, 2008
INVENTOR(S)       : Kawakami et al.

It is certified that error appears in the above-identified patent and that said Letters Patent is hereby corrected as shown below:

COLUMN 25:
　　Line 8, "$f_{1-T}^{1}$" should read -- $f_{-T,}^{I}$ --.

COLUMN 27:
　　Line 46, "battery" should read -- batteries --.

COLUMN 29:
　　Line 11, "a" should read -- an --; and

Line 20, "|145.4-1|/144.1×100=0.9(%)." should read

-- |145.4-144.1|/144.1×100=0.9(%). --.

COLUMN 30:
　　Line 52, "to be" should be deleted.

COLUMN 33:
　　Line 20, "valued" should read -- value --.

COLUMN 35:
　　Line 1, "resistance" should read -- resistance of --.

COLUMN 36:
　　Line 22, "have" should read -- are --; and
　　Line 25, "tion,in" should read -- tion, in --.

UNITED STATES PATENT AND TRADEMARK OFFICE
CERTIFICATE OF CORRECTION

PATENT NO.       : 7,388,383 B2
APPLICATION NO.  : 11/656995
DATED            : June 17, 2008
INVENTOR(S)      : Kawakami et al.

It is certified that error appears in the above-identified patent and that said Letters Patent is hereby corrected as shown below:

COLUMN 40:
Line 34, "$C_d{'}=C_N \mathrm{x} f_{-T,I}(R_1)$" should read -- $C_d{'}=C_N \mathrm{x} f_{-T,I}(R)$ --.

Signed and Sealed this

Sixteenth Day of December, 2008

JON W. DUDAS
*Director of the United States Patent and Trademark Office*